(12) United States Patent
Kim et al.

(10) Patent No.: US 11,780,229 B2
(45) Date of Patent: Oct. 10, 2023

(54) INKJET PRINTING DEVICE AND METHOD OF ADDRESSING NON-DISCHARGE THEREIN

(71) Applicant: Samsung Display Co., LTD., Yongin-si (KR)

(72) Inventors: Han Su Kim, Seoul (KR); Eun A Yang, Yongin-si (KR); Woong Bae Kim, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/474,589

(22) Filed: Sep. 14, 2021

(65) Prior Publication Data
US 2022/0161561 A1     May 26, 2022

(30) Foreign Application Priority Data
Nov. 20, 2020    (KR) .................. 10-2020-0156485

(51) Int. Cl.
| | | |
|---|---|---|
| B41J 2/165 | (2006.01) | |
| B41J 2/175 | (2006.01) | |
| H01L 33/44 | (2010.01) | |
| H01L 33/24 | (2010.01) | |
| H01L 27/15 | (2006.01) | |

(52) U.S. Cl.
CPC ....... *B41J 2/16523* (2013.01); *B41J 2/17596* (2013.01); *H01L 27/156* (2013.01); *H01L 33/24* (2013.01); *H01L 33/44* (2013.01)

(58) Field of Classification Search
CPC ................ B41J 2/16508; B41J 2/16523; B41J 2/16552; B41J 2/17596; B41J 2/18; B41J 2/20; H01L 27/156; H01L 33/44; H01L 51/0005; H01L 33/24
See application file for complete search history.

(56) References Cited

U.S. PATENT DOCUMENTS

2021/0336142 A1    10/2021    Jeong et al.

FOREIGN PATENT DOCUMENTS

| | | | |
|---|---|---|---|
| JP | | 4503941 | 7/2010 |
| JP | | 6265685 | 1/2018 |
| JP | | 6265685 B2 * | 1/2018 |
| KR | 10-2019-0039686 | | 4/2019 |
| KR | 2019-0039686 A * | | 4/2019 |
| KR | 10-2020-0034897 | | 4/2020 |
| KR | 10-2095948 | | 4/2020 |

(Continued)

OTHER PUBLICATIONS

International Search Report corresponding to International Application No. PCT/KR2021/016884 dated Feb. 21, 2022.

(Continued)

*Primary Examiner* — Jannelle M Lebron
(74) *Attorney, Agent, or Firm* — KILE PARK REED & HOUTTEMAN PLLC

(57) ABSTRACT

An inkjet printing device and a method of addressing non-discharge. The inkjet printing device comprises a print head including nozzles that discharge an ink including light emitting elements, a dipping bath in which the print head is immersed and which includes a suction solution, and a suctioning part which is connected to the print head and suctions the suction solution along with the ink remaining in the print head unit.

17 Claims, 16 Drawing Sheets

(56) References Cited

FOREIGN PATENT DOCUMENTS

| KR | 20200034897 A | * | 4/2020 |
| KR | 10-2020-0108950 | | 9/2020 |
| WO | 2020/138702 | | 7/2020 |
| WO | 2021/225284 | | 11/2021 |

OTHER PUBLICATIONS

Written Opinion corresponding to International Application No. PCT/KR2021/016884 dated Feb. 21, 2022.

* cited by examiner

0μs                    30μs                    60μs

0μs                    30μs                    60μs

INKJET PRINTING DEVICE AND METHOD OF ADDRESSING NON-DISCHARGE THEREIN

CROSS-REFERENCE TO RELATED APPLICATION(S)

This application claims priority to and benefits of Korean Patent Application No. 10-2020-0156485 under 35 U.S.C. § 119, filed on Nov. 20, 2020 in the Korean Intellectual Property Office, the entire contents of which are incorporated herein by reference.

BACKGROUND

1. Technical Field

The disclosure relates to an inkjet printing device and a method of addressing non-discharge therein.

2. Description of the Related Art

With the development of multimedia, the importance of display devices has increased. Correspondingly, various kinds of display devices such as an organic light emitting diode (OLED) display device and a liquid crystal display (LCD) device are in use.

Display devices include display panels, such as an OLED display panel or an LCD panel, as devices that display images. A display device may include a light emitting element (e.g., a light emitting diode (LED) as a light emitting display panel. Examples of LEDs include an OLED that uses an organic material as a fluorescent material, and an inorganic LED that uses an inorganic material as a fluorescent material.

An inkjet printing device may be used to form an organic layer included in a display device or to form an inorganic LED element. The transfer of the inorganic LED element or the formation of the organic layer may also be performed by printing an arbitrary ink or solution by inkjet printing and then performing a post-treatment process. In the inkjet printing device, a predetermined ink or solution may be supplied to an inkjet head, and the inkjet head may perform a process of ejecting the ink or solution onto a substrate to be treated (for example, a target substrate).

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide an inkjet printing device and a method capable of addressing non-discharge of ink that occurs due to light emitting elements remaining in an inkjet head.

According to an embodiment of the disclosure, the inkjet printing device may include a print head including nozzles that discharge an ink including light emitting elements, a dipping bath in which the print head may be immersed and which includes a suction solution, and a suctioning part which may be connected to the print head and may suction the suction solution along with the ink remaining in the print head.

In an embodiment, the inkjet printing device may further include a first connecting tube which may be connected to a first end of the print head and along which the ink may be supplied to the print head, a second connecting tube which may be connected to a second end of the print head and along which the ink may be moved from the print head, a first valve disposed in the first connecting tube and adjusting supply of the ink, and a second valve disposed in the second connecting tube and adjusting a flow rate of the ink.

In an embodiment, the suctioning part may include a third connecting tube connected to the second connecting tube, a suction pump connected to the third connecting tube and transmitting suction force to the ink, and a suctioned ink storage part which may be connected to an end of the third connecting tube and in which the ink supplied through the suction pump may be stored.

In an embodiment, the third connecting tube may be connected to the second connecting tube through the second valve, and the ink moves to the second connecting tube or the third connecting tube in accordance with opening and closing of the second valve.

In an embodiment, the second valve may be a three-way valve.

In an embodiment, the dipping bath may include the suction solution and may be provided separately from the print head.

In an embodiment, the suction solution may be the ink or a solvent included in the ink.

In an embodiment, the inkjet printing device may further comprise a first circulating ink storage part in which the ink may be stored, a second circulating ink storage part which receives the ink from the first circulating ink storage part and may be connected to the second connecting tube, a circulation pump that moves the ink from the second circulating ink storage part, and a third circulating ink storage part that receives the ink from the circulation pump, wherein the third circulating ink storage part may be connected to the first connecting tube and supplies the ink to the print head.

In an embodiment, the print head may include an inkjet head, the inkjet head including an inlet connected from the first connecting tube, an internal tube that passes through an inner portion of the inkjet head from the inlet, piezo chambers connected from the internal tube to a lower portion thereof, and an outlet which may be disposed on a side of the internal tube that may be opposite to the inlet and may be connected to the second connecting tube, and each of the nozzles may be disposed in one of the piezo chambers.

According to an embodiment of the disclosure, a method may be provided of addressing non-discharge in an inkjet printing device that may include a print head including nozzles that discharge an ink including light emitting elements, a dipping bath in which the print head may be immersed and which may include a suction solution, and a suctioning part which may be connected to the print head and may suction the suction solution along with the ink remaining in the print head. The method may include immersing the print head in the dipping bath, closing a first valve connected to a first end of the print head and switching a second valve connected to a second end of the print head, and driving a suction pump of the suctioning part connected to the second valve to suction the suction solution included in the dipping bath through the print head along with the ink remaining in the print head.

In an embodiment, the immersing of the print head in the dipping bath may include immersing the print head so that nozzles of an inkjet head provided in the print head are immersed in the suction solution.

In an embodiment, the inkjet printing device may include a first connecting tube which may be connected to a first end of the print head and along which the ink may be supplied to the print head, and a second connecting tube which may be connected to a second end of the print head and along which the ink may be moved from the print head, the first valve may be disposed in the first connecting tube and adjust supply of the ink, and the second valve may be disposed in the second connecting tube and adjust a flow rate of the ink.

In an embodiment, the suctioning part may include a third connecting tube connected to the second connecting tube, a suction pump connected to the third connecting tube and transmitting suction force to the ink, and a suctioned ink storage part which may be connected to an end of the third connecting tube and in which the ink supplied through the suction pump may be stored.

In an embodiment, the closing of the first valve and switching of the second valve comprises closing the first valve to block movement of the ink to the first connecting tube, and switching the second valve to form a flow path in which the ink may be movable through the second connecting tube and the third connecting tube.

In an embodiment, by driving the suction pump, a suction force may act on the third connecting tube connected to the pressure pump and act on the second valve, the second connecting tube, and the print head to suction the suction solution.

In an embodiment, the print head may include an inkjet head, the inkjet head may include a piezo chamber and nozzles, and the suction solution may be suctioned from the nozzles.

In an embodiment, as the suction solution may be suctioned through the nozzles, a turbulent flow may be formed in the piezo chamber connected to the nozzles.

In an embodiment, due to the turbulent flow, light emitting elements of the ink that may be accumulated in the piezo chamber float, and along with the suction solution, the ink including the light emitting elements may be suctioned to the suctioning part through the second connecting tube.

In an embodiment, the ink and the suction solution may be stored in the suctioned ink storage part through the suction pump of the suctioning part.

In an embodiment, the method further comprises, after the suctioning of the suction solution and the ink, opening the first valve and switching the second valve to block movement of the ink to the third connecting tube.

It should be noted that aspects of the disclosure are not limited to the above, and other unmentioned aspects of the disclosure will be apparent to those skilled in the art from the following descriptions.

BRIEF DESCRIPTION OF THE DRAWINGS

The above and other aspects and features of the disclosure will become more apparent by describing embodiments thereof in detail with reference to the attached drawings, in which.

DETAILED DESCRIPTION OF THE EMBODIMENTS

Figure 1:
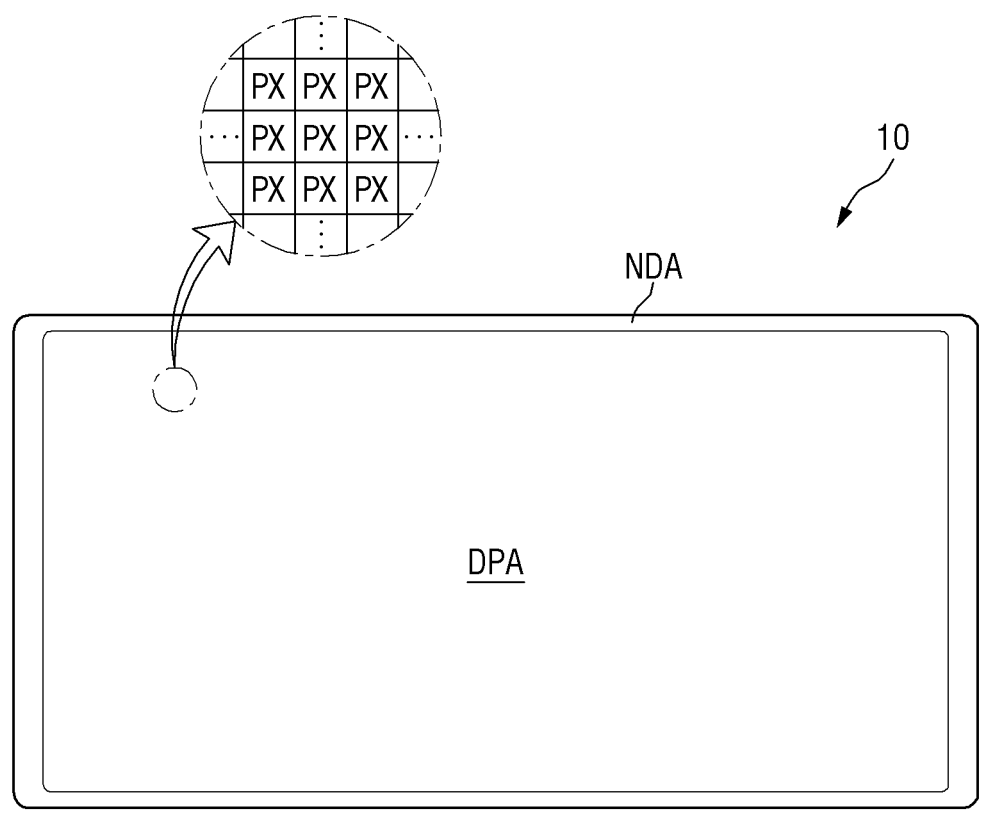
FIG. 1 is a schematic plan view of a display device according to an embodiment.
Figure 1:
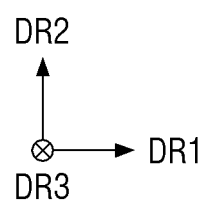

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the singular forms, "a," "an," and "the" are intended to include the plural forms as well (and vice versa), unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will also be understood that when a layer is referred to as being "on" (or, e.g., connected to) another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Each of the features of the various embodiments of the disclosure may be combined or combined with each other, in part or in whole, and technically various interlocking and driving may be possible. Each embodiment may be implemented independently of each other or may be implemented together in an association.

It will be understood that the terms "connected to" or "coupled to" may include a physical or electrical connection or coupling.

"About", "approximately", "around", etc. as used herein are inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that the terms "connected to" or "coupled to" may include a physical connection, a fluid connection, and/or an electrical connection or coupling.

Hereinafter, specific embodiments will be described with reference to the accompanying drawings.

FIG. 1 is a schematic plan view of a display device according to an embodiment.

Referring to FIG. 1, a display device 10 may display a video or still images. The display device 10 may refer to any electronic device that provides a display screen. Examples of the display device 10 may include a television, a laptop, a monitor, a billboard, an Internet of Things device, a mobile phone, a smartphone, a tablet personal computer (PC), an electronic watch, a smartwatch, a watch phone, a head-mounted display, a mobile communication terminal, an electronic note, an electronic book, a portable multimedia player (PMP), a navigation system, a gaming device, a digital camera, and a camcorder that provide a display screen.

The display device 10 may include a display panel that provides a display screen. Examples of the display panel may include an inorganic light-emitting diode (LED) display panel, an organic LED display panel, a quantum-dot LED display panel, a plasma display panel, and a field emission display panel. Hereinafter, a case in which the display panel may be an inorganic LED display panel will be described as an example, but the disclosure is not limited thereto, and the display panel may also be various other display panels.

A first direction DR1, a second direction DR2, and a third direction DR3 may be defined in the drawings for describing the display device 10. The first direction DR1 and the second direction DR2 may be directions perpendicular to each other in a single plane. The third direction DR3 may be a direction perpendicular to the plane in which the first direction DR1 and the second direction DR2 may be located. The third direction DR3 may be perpendicular to each of the first direction DR1 and the second direction DR2. In embodiments for describing the display device 10, the third direction DR3 may indicate a thickness direction of the display device 10.

The shape of the display device 10 may be modified in various ways. For example, the display device 10 may have a rectangular shape in which sides in the first direction DR1 may be longer than sides in the second direction DR2 in plan view. As another example, the display device 10 may also have a rectangular shape in which sides in the second direction DR2 may be longer than sides in the first direction DR1 in plan view. However, the shape of the display device 10 is not limited thereto, and the display device 10 may also have other shapes such as a square shape, a quadrilateral shape with round corners (vertices), other polygonal shapes, a circular shape, and the like. The shape of a display area DPA of the display device 10 may also be similar to the overall shape of the display device 10. FIG. 1 illustrates an example in which the display device 10 and the display area DPA may have a rectangular shape in which sides in the first direction DR1 may be longer than sides in the second direction DR2.

The display device 10 may include the display area DPA and a non-display area NDA. The display area DPA may be an area in which a screen may be displayed, and the non-display area NDA may be an area in which the screen may not be displayed. The display area DPA may be referred to as an active area, and the non-display area NDA may be referred to as an inactive area. The display area DPA may generally occupy the center of the display device 10.

The display area DPA may include pixels PX. The pixels PX may be arranged in rows and columns. The shape of each pixel PX may be rectangular or square in plan view, but the shape of each pixel PX is not limited thereto and may also be a rhombic shape in which each side may be tilted in one direction. The pixels PX may be alternately arranged in a stripe pattern or in the PenTile® matrix. The pixels PX may each include one or more light emitting elements 30 (see FIG. 2), which may emit light in a specific wavelength band, to display a specific color.

The non-display area NDA may be disposed around the display area DPA. The non-display area NDA may surround the display area DPA entirely or partially. The display area DPA may have a rectangular shape, and the non-display area NDA may be disposed to be adjacent to the four sides of the display area DPA. The non-display area NDA may constitute a bezel of the display device 10. In each non-display area NDA, lines or circuit driving parts included in the display device 10 may be disposed, or external devices may be mounted.

Figure 2:
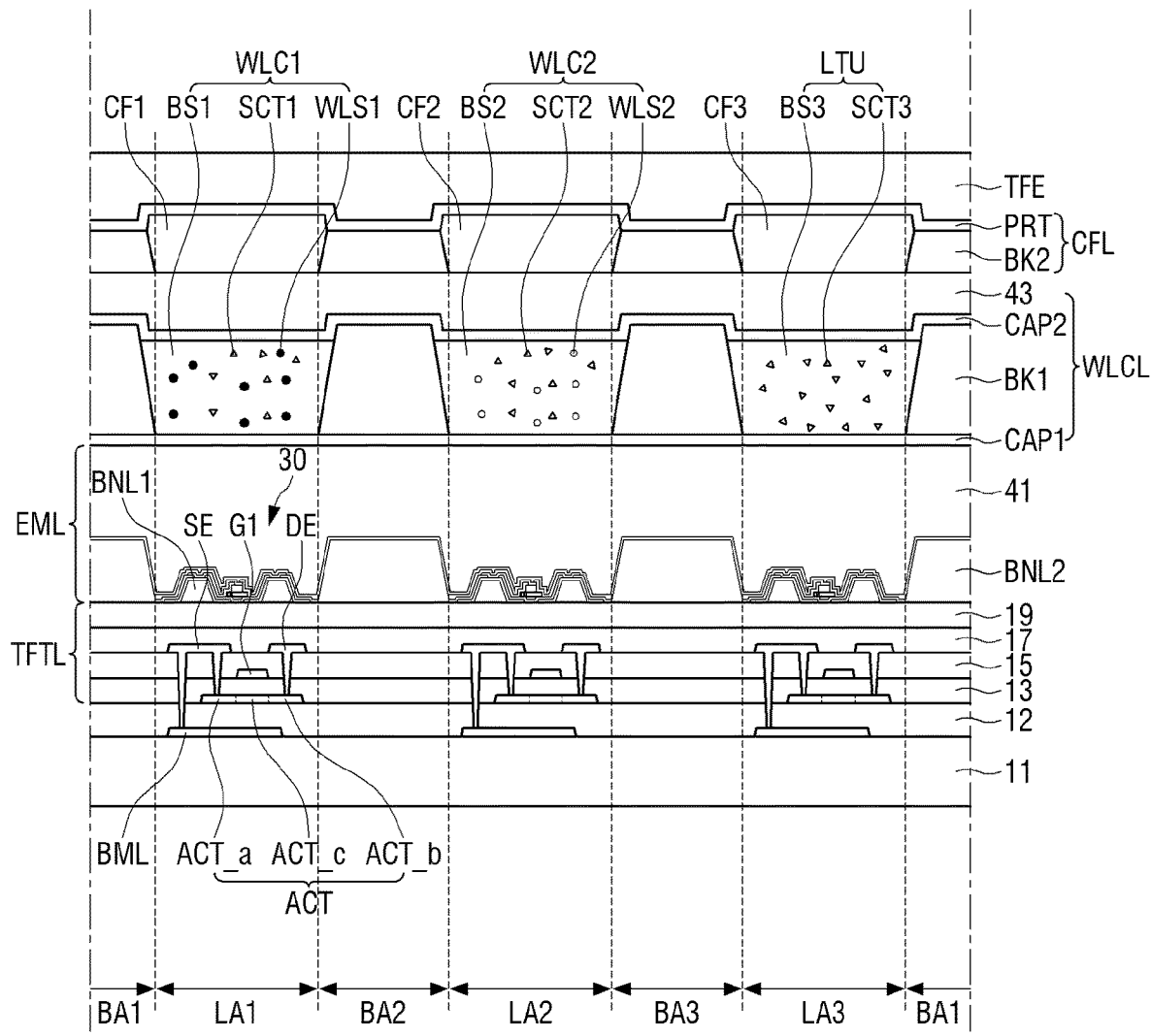
FIG. 2 is a cross-sectional view schematically illustrating certain sub-pixels of the display device according to an embodiment.

FIG. 2 is a cross-sectional view schematically illustrating certain sub-pixels of the display device according to an embodiment.

Referring to FIG. 2, the display area DPA of the display device 10 may include first to third light emitting areas LA1, LA2, and LA3. Each of the first to third light emitting areas LA1, LA2, and LA3 may be an area through which light generated by the light emitting elements 30 of the display device 10 may be emitted to the outside of the display device 10.

The display device 10 may include a substrate 11, a buffer layer 12, a transistor layer TFTL, a light emitting element layer EML, a wavelength conversion layer WLCL, a color filter layer CFL, and an encapsulation layer TFE.

The substrate 11 may be a base substrate or a base member and may be made of an insulating material such as a polymer resin. For example, the substrate 11 may be a flexible substrate that may be bendable, foldable, rollable, and the like. The substrate 11 may include polyimide (PI), but the disclosure is not limited thereof.

The buffer layer 12 may be disposed on the substrate 11. The buffer layer 12 may be made of an inorganic layer that may be able to prevent the permeation of air or moisture. For example, the buffer layer 12 may include inorganic layers that may be alternately stacked on each other.

The transistor layer TFTL may be disposed on the buffer layer 12. The transistor layer TFTL may include a first transistor T1, a first gate insulating layer 13, a first interlayer insulating layer 15, a second interlayer insulating layer 17, and a first planarization layer 19.

The first transistor T1 may be disposed on the buffer layer 12 and constitute a pixel circuit of each of the pixels. For example, the first transistor T1 may be a driving transistor or a switching transistor of a pixel circuit. The first transistor T1 may include an active layer ACT, a gate electrode G1, a source electrode SE, and a drain electrode DE. The active layer ACT may include conductive areas ACT_a and ACT_b and a channel area ACT_c therebetween.

The light emitting element layer EML may be disposed on the transistor layer TFTL. The light emitting element layer EML may include a first pattern BNL1, the light emitting element 30, and a second pattern BNL2. The light emitting element 30 may be disposed on the first transistor T1. The light emitting element 30 may be disposed between a first electrode and a second electrode and connected to each of a first connection electrode and a second connection electrode.

The transistor layer TFTL and the light emitting element layer EML will be described in more detail below with reference to FIGS. 3 to 5.

A second planarization layer 41 may be disposed in the light emitting element layer EML to planarize an upper end of the light emitting element layer EML. The second planarization layer 41 may include an organic material. For example, the second planarization layer 41 may include at least one of an acrylic resin, an epoxy resin, a phenolic resin, a polyamide resin, and a PI resin.

The wavelength conversion layer WLCL may include a first capping layer CAP1, a first light blocking member BK1, a first wavelength conversion part WLC1, a second wavelength conversion part WLC2, a light transmission part LTU, a second capping layer CAP2, and a third planarization layer 43.

The first capping layer CAP1 may be disposed on the second planarization layer 41 of the light emitting element layer EML. The first capping layer CAP1 may seal lower surfaces of the first and second wavelength conversion parts WLC1 and WLC2 and a lower surface of the light transmission part LTU. The first capping layer CAP1 may include an inorganic material. For example, the first capping layer CAP1 may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride.

The first light blocking member BK1 may be disposed in first to third light blocking areas BA1, BA2, and BA3 on the first capping layer CAP1. The first light blocking member BK1 may overlap the second pattern BNL2 in the thickness direction. The first light blocking member BK1 may block the transmission of light. The first light blocking member BK1 may prevent the intrusion of light between the first to third light emitting areas LA1, LA2, and LA3 and prevent the mixing of colors, thereby improving color reproduction. In plan view, the first light blocking member BK1 may be disposed in the form of grids that surround the first to third light emitting areas LA1, LA2, and LA3.

The first light blocking member BK1 may include an organic light blocking material and a liquid-repellent component. Here, the liquid-repellent component may include a fluorine-containing monomer or a fluorine-containing polymer, and specifically, may include a fluorine-containing aliphatic polycarbonate. For example, the first light blocking member BK1 may include a black organic material including a liquid-repellent component. The first light blocking member BK1 may be formed through coating with an organic light-blocking material including a liquid-repellent component, an exposure process, and the like.

By including the liquid-repellent component, the first light blocking member BK1 may separate the first and second wavelength conversion parts WLC1 and WLC2 and the light transmission part LTU into the corresponding light emitting areas LA. For example, in a case in which the first and second wavelength conversion parts WLC1 and WLC2 and the light transmission part LTU may be formed using an inkjet method, ink compositions may flow on an upper surface of the first light blocking member BK1. In this case, by including the liquid-repellent component, the first light blocking member BK1 may guide each ink composition to flow into one of the light emitting areas. Consequently, the first light blocking member BK1 may prevent the ink compositions from being mixed.

The first wavelength conversion part WLC1 may be disposed in the first light emitting area LA1 on the first capping layer CAP1. The first wavelength conversion part WLC1 may be surrounded by the first light blocking member BK1. The first wavelength conversion part WLC1 may include a first base resin BS1, a first scatterer SCT1, and a first wavelength shifter WLS1.

The first base resin BS1 may include a material with relatively high light transmittance. The first base resin BS1 may be made of a transparent organic material. For example, the first base resin BS1 may include at least one of organic materials such as an epoxy-based resin, an acrylic-based resin, a cardo-based resin, and an imide-based resin.

The first scatterer SCT1 may have a refractive index different from that of the first base resin BS1 and may form an optical interface with the first base resin BS1. For example, the first scatterer SCT1 may include a light scattering material or light scattering particles that scatter at least a portion of transmitted light. For example, the first scatterer SCT1 may include metal oxide particles such as titanium oxide ($TiO_2$), zirconium oxide ($ZrO_2$), aluminum oxide ($Al_xO_y$), indium oxide ($In_2O_3$), zinc oxide (ZnO), tin oxide ($SnO_2$), or a combination thereof or may include organic particles such as an acrylic-based resin or a urethane-based resin. The first scatterer SCT1 may, while substantially not converting a peak wavelength of incident light, scatter light in a random direction regardless of a direction of incidence of the incident light.

The first wavelength shifter WLS1 may convert or shift the peak wavelength of the incident light to a first peak wavelength. For example, the first wavelength shifter WLS1 may convert blue light provided from the display device 10 to red light, which has a single peak wavelength in a range of about 610 nm to about 650 nm, and emit the red light. The first wavelength shifter WLS1 may be a quantum dot, a quantum rod, or a fluorescent body. The quantum dot may be a particulate material that emits a specific color as electrons transition from a conduction band to a valence band.

For example, the quantum dot may be a semiconductor nanocrystal material. The quantum dot may have a specific bandgap according to the composition and size thereof and may absorb light and then emit light having a unique wavelength. Examples of the semiconductor nanocrystals of the quantum dot may include group IV nanocrystals, group II-VI compound nanocrystals, group III-V compound nanocrystals, group IV-VI compound nanocrystals, or a combination thereof.

For example, the quantum dot may have a core-shell structure that includes a core including the nanocrystals and a shell surrounding the core. The shell of the quantum dot may serve as a protective layer that prevents chemical modification of the core to maintain semiconductor characteristics and may serve as a charging layer that imparts an electrophoretic characteristic to the quantum dot. The shell may include a single layer or multiple layers. An interface between the core and the shell may have a concentration gradient in which a concentration of an element present in the shell decreases in a direction toward the center. The shell of the quantum dot may be made of metal or non-metal oxide, a semiconductor compound, or a combination thereof.

A full width at half maximum (FWHM) of the wavelength spectrum of light emitted by the first wavelength shifter WLS1 may be about 45 nm or less, about 40 nm or less, or about 30 nm or less, and the light may further improve color purity and color reproduction of colors displayed by the display device 10. The light emitted by the first wavelength shifter WLS1 may be emitted in various directions regardless of the direction of incidence of the incident light. Consequently, the side visibility of red color displayed in the first light emitting area LA1 may be improved.

A portion of blue light provided from the light emitting element layer EML may pass through the first wavelength conversion part WLC1 without being converted to red light by the first wavelength shifter WLS1. A portion of the blue light provided from the light emitting element layer EML that may be incident on a first color filter CF1 without being converted by the first wavelength conversion part WLC1 may be blocked by the first color filter CF1. A portion of the blue light provided from the light emitting element layer EML that may be converted to red light by the first wavelength conversion part WLC1 may pass through the first color filter CF1 and may be output to the outside. Consequently, the first light emitting area LA1 may emit red light.

The second wavelength conversion part WLC2 may be disposed in the second light emitting area LA2 on the first capping layer CAP1. The second wavelength conversion part WLC2 may be surrounded by the first light blocking member BK1. The second wavelength conversion part WLC2 may include a second base resin BS2, a second scatterer SCT2, and a second wavelength shifter WLS2.

The second base resin BS2 may include a material with relatively high light transmittance. The second base resin BS2 may be made of a transparent organic material. For example, the second base resin BS2 and the first base resin BS1 may be made of a same material or may be made of any material listed above as an example of the material of the first base resin BS1.

The second scatterer SCT2 may have a refractive index different from that of the second base resin BS2 and may form an optical interface with the second base resin BS2. For example, the second scatterer SCT2 may include a light scattering material or light scattering particles that scatter at least a portion of transmitted light. For example, the second scatterer SCT2 and the first scatterer SCT1 may be made of a same material or may be made of any material listed above as an example of the material of the first scatterer SCT1. The second scatterer SCT2 may, while substantially not converting a peak wavelength of incident light, scatter light in a random direction regardless of a direction of incidence of the incident light.

The second wavelength shifter WLS2 may convert or shift the peak wavelength of the incident light to a second peak wavelength that may be different from the first peak wavelength of the first wavelength shifter WLS1. For example, the second wavelength shifter WLS2 may convert blue light provided from the display device 10 to green light, which has a single peak wavelength in a range of about 510 nm to about 550 nm, and emit the green light. The second wavelength shifter WLS2 may be a quantum dot, a quantum rod, or a fluorescent body. The second wavelength shifter WLS2 may include a material having the same effect as any material listed above as an example of the material of the first wavelength shifter WLS1. The second wavelength shifter WLS2 may be made of a quantum dot, a quantum rod, or a fluorescent body so that a wavelength conversion range of the second wavelength shifter WLS2 may be different from a wavelength conversion range of the first wavelength shifter WLS1.

The light transmission part LTU may be disposed in the third light emitting area LA3 on the first capping layer CAP1. The light transmission part LTU may be surrounded by the first light blocking member BK1. The light transmission part LTU may maintain a peak wavelength of incident light to transmit light. The light transmission part LTU may include a third base resin BS3 and a third scatterer SCT3.

The third base resin BS3 may include a material with relatively high light transmittance. The third base resin BS3 may be made of a transparent organic material. For example, the third base resin BS3 and the first base resin BS1 or the second base resin BS2 may be made of a same material or may be made of any material listed above as an example of the material of the first base resin BS1 or the second base resin BS2.

The third scatterer SCT3 may have a refractive index different from that of the third base resin BS3 and may form an optical interface with the third base resin BS3. For example, the third scatterer SCT3 may include a light scattering material or light scattering particles that scatter at least a portion of transmitted light. For example, the third scatterer SCT3 and the first scatterer SCT1 or the second scatterer SCT2 may be made of a same material or may be made of any material listed above as an example of the material of the first scatterer SCT1 or the second scatterer SCT2. The third scatterer SCT3 may, while substantially not converting a peak wavelength of incident light, scatter light in a random direction regardless of a direction of incidence of the incident light.

The wavelength conversion layer WLCL may be disposed directly on the second planarization layer 41 of the light emitting element layer EML, and thus the display device 10 may not require a separate substrate for the first and second wavelength conversion parts WLC1 and WLC2 and the light transmission part LTU. Consequently, the first and second wavelength conversion parts WLC1 and WLC2 and the light transmission part LTU may be respectively and easily aligned with the first to third light emitting areas LA1, LA2, and LA3, and the thickness of the display device 10 may be relatively reduced.

The second capping layer CAP2 may cover the first and second wavelength conversion parts WLC1 and WLC2, the light transmission part LTU, and the first light blocking member BK1. For example, the second capping layer CAP2 may seal the first and second wavelength conversion parts WLC1 and WLC2 and the light transmission part LTU to prevent damage to or contamination of the first and second wavelength conversion parts WLC1 and WLC2 and the light transmission part LTU. The second capping layer CAP2 and the first capping layer CAP1 may be made of a same material or may be made of any material listed above as an example of the material of the first capping layer CAP1.

The third planarization layer 43 may be disposed on an upper portion of the second capping layer CAP2 to planarize upper ends of the first and second wavelength conversion parts WLC1 and WLC2 and an upper end of the light transmission part LTU. The third planarization layer 43 may include an organic material. For example, the third planarization layer 43 may include at least one of an acrylic resin, an epoxy resin, a phenolic resin, a polyamide resin, and a PI resin.

The color filter layer CFL may include a second light blocking member BK2, first to third color filters CF1, CF2, and CF3, and a protective layer PRT.

The second light blocking member BK2 may be disposed in the first to third light blocking areas BA1, BA2, and BA3 on the third planarization layer 43 of the wavelength conversion layer WLCL. The second light blocking member BK2 may overlap the first light blocking member BK1 or the second pattern BNL2 in the thickness direction. The second light blocking member BK2 may block the transmission of light. The second light blocking member BK2 may prevent the intrusion of light between the first to third light emitting areas LA1, LA2, and LA3 and prevent the mixing of colors, thereby improving color reproduction. In plan view, the second light blocking member BK2 may be disposed in the form of grids that surround the first to third light emitting areas LA1, LA2, and LA3.

The first color filter CF1 may be disposed in the first light emitting area LA1 on the third planarization layer 43. The first color filter CF1 may be surrounded by the second light blocking member BK2. The first color filter CF1 may overlap the first wavelength conversion part WLC1 in the thickness direction. The first color filter CF1 may selectively transmit light of a first color (for example, red light) and may block or absorb light of a second color (for example, green light) and light of a third color (for example, blue light). For example, the first color filter CF1 may be a red color filter and may include a red colorant. The red colorant may include a red dye or a red pigment.

The second color filter CF2 may be disposed in the second light emitting area LA2 on the third planarization layer 43. The second color filter CF2 may be surrounded by the second light blocking member BK2. The second color filter CF2 may overlap the second wavelength conversion part WLC2 in the thickness direction. The second color filter CF2 may selectively transmit the light of the second color (for example, green light) and may block or absorb the light of the first color (for example, red light) and the light of the third color (for example, blue light). For example, the second color filter CF2 may be a green color filter and may include a green colorant. The green colorant may include a green dye or a green pigment.

The third color filter CF3 may be disposed in the third light emitting area LA3 on the third planarization layer 43. The third color filter CF3 may be surrounded by the second light blocking member BK2. The third color filter CF3 may overlap the light transmission part LTU in the thickness direction. The third color filter CF3 may selectively transmit the light of the third color (for example, blue light) and may block or absorb the light of the first color (for example, red light) and the light of the second color (for example, green light). For example, the third color filter CF3 may be a blue color filter and may include a blue colorant. The blue colorant may include a blue dye or a blue pigment.

The first to third color filters CF1, CF2, and CF3 may absorb a portion of light entering from the outside of the display device 10 to reduce reflected light due to external light. Consequently, the first to third color filters CF1, CF2, and CF3 may prevent color distortion due to the reflection of external light.

The first to third color filters CF1, CF2, and CF3 may be disposed directly on the third planarization layer 43 of the wavelength conversion layer WLCL, and thus the display device 10 may not require a separate substrate for the first to third color filters CF1, CF2, and CF3. Consequently, the thickness of the display device 10 may be relatively reduced The protective layer PRT may cover the first to third color filters CF1, CF2, and CF3. The protective layer PRT may protect the first to third color filters CF1, CF2, and CF3.

The encapsulation layer TFE may be disposed on the protective layer PRT of the color filter layer CFL. The encapsulation layer TFE may cover an upper surface and a side surface of a display layer. For example, the encapsulation layer TFE may include at least one inorganic layer to prevent the permeation of oxygen or moisture. The encapsulation layer TFE may include at least one organic layer to protect the display device 10 from foreign matter such as dust. For example, the encapsulation layer TFE may have a structure in which at least one organic layer may be stacked between two inorganic layers. The inorganic layers may each include silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride, lithium fluoride, and the like, or a combination thereof. The organic layer may include an acrylic-based resin, a methacrylate-based resin, polyisoprene, a vinyl-based resin, an epoxy-based resin, a urethane-based resin, a cellulose-based resin, a perylene-based rein, and the like, or a combination thereof. However, the structure of the encapsulation layer TFE is not limited to the above example, and the stacked structure may be changed in various ways.

Hereinafter, the transistor layer TFTL and the light emitting element layer EML will be described in detail on the basis of a planar and cross-sectional structure of one pixel of the display device according to an embodiment.

Figure 3:
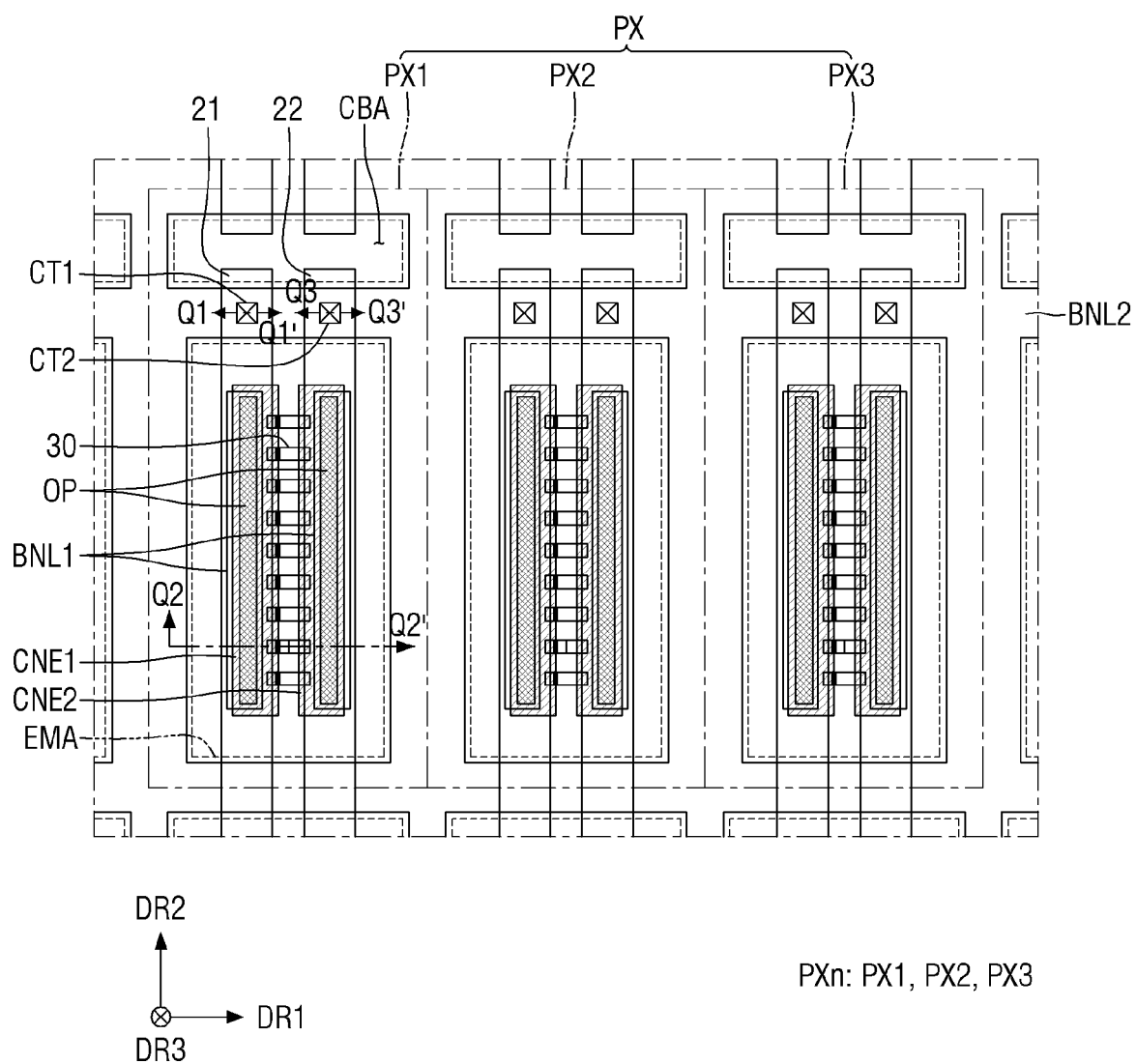
FIG. 3 is a plan view schematically illustrating a pixel of the display device according to an embodiment.

FIG. 3 is a plan view schematically illustrating a pixel of the display device according to an embodiment.

Referring to FIG. 3, the pixels PX may each include sub-pixels PXn (where n may be an integer in a range of 1 to 3). For example, a single pixel PX may include a first sub-pixel PX1, a second sub-pixel PX2, and a third sub-pixel PX3. The first sub-pixel PX1 may emit light of a first color, the second sub-pixel PX2 may emit light of a second color, and the third sub-pixel PX3 may emit light of a third color. For example, the first color may be blue, the second color may be green, and the third color may be red. However, the disclosure is not limited thereto, and each sub-pixel PXn may also emit light of the same color. Although FIG. 3 illustrates an example in which the pixel PX includes three sub-pixels PXn, the disclosure is not limited thereto, and the pixel PX may include more sub-pixels PXn.

Each sub-pixel PXn of the display device 10 may include a light emitting area EMA and a non-light emitting area (not illustrated). The light emitting area EMA may be an area in which the light emitting element 30 may be disposed and from which light in a specific wavelength band may be output, and the non-light emitting area may be an area in which the light emitting element 30 may not be disposed and which may not be reached by light emitted from the light emitting element 30, thus not outputting light. The light emitting area may include an area in which the light emitting element 30 may be disposed and an area which may be adjacent to the light emitting element 30 and to which the light emitted from the light emitting element 30 may be output.

The disclosure is not limited thereto, and the light emitting area may also include an area to which light emitted from the light emitting element 30 may be output due to being reflected or refracted by another member. The light emitting elements 30 may each be disposed in one sub-pixel PXn and, by including areas in which the light emitting elements 30 may be disposed and areas adjacent thereto, form the light emitting area.

Each sub-pixel PXn may include a cut portion area CBA disposed in the non-light emitting area. The cut portion area CBA may be disposed at one side of the light emitting area EMA in the second direction DR2. The cut portion area CBA may be disposed between the light emitting areas EMA of the sub-pixels PXn that may be adjacent in the second direction DR2. The light emitting areas EMA and cut portion areas CBA may be arranged in the display area DPA of the display device 10. For example, each of the light emitting areas EMA and the cut portion areas CBA may be repeatedly arranged in the first direction DR1 while the light emitting areas EMA and the cut portion areas CBA may be alternately arranged in the second direction DR2. Intervals at which the cut portion areas CBA may be spaced apart from each other in the first direction DR1 may be smaller than intervals at which the light emitting areas EMA may be spaced apart from each other in the first direction DR1. The second pattern BNL2 may be disposed between the cut portion areas CBA and the light emitting areas EMA, and the intervals between the cut portion areas CBA and the light emitting areas EMA may be changed according to the width of the second pattern BNL2. Although the light emitting element 30 may not be disposed in the cut portion area CBA and thus light may not be output therefrom, portions of electrodes 21 and 22 disposed in each sub-pixel PXn may be disposed in the cut portion area CBA. The electrodes 21 and 22 disposed in each sub-pixel PXn may be separated from each other and disposed in the cut portion area CBA.

Figure 4:
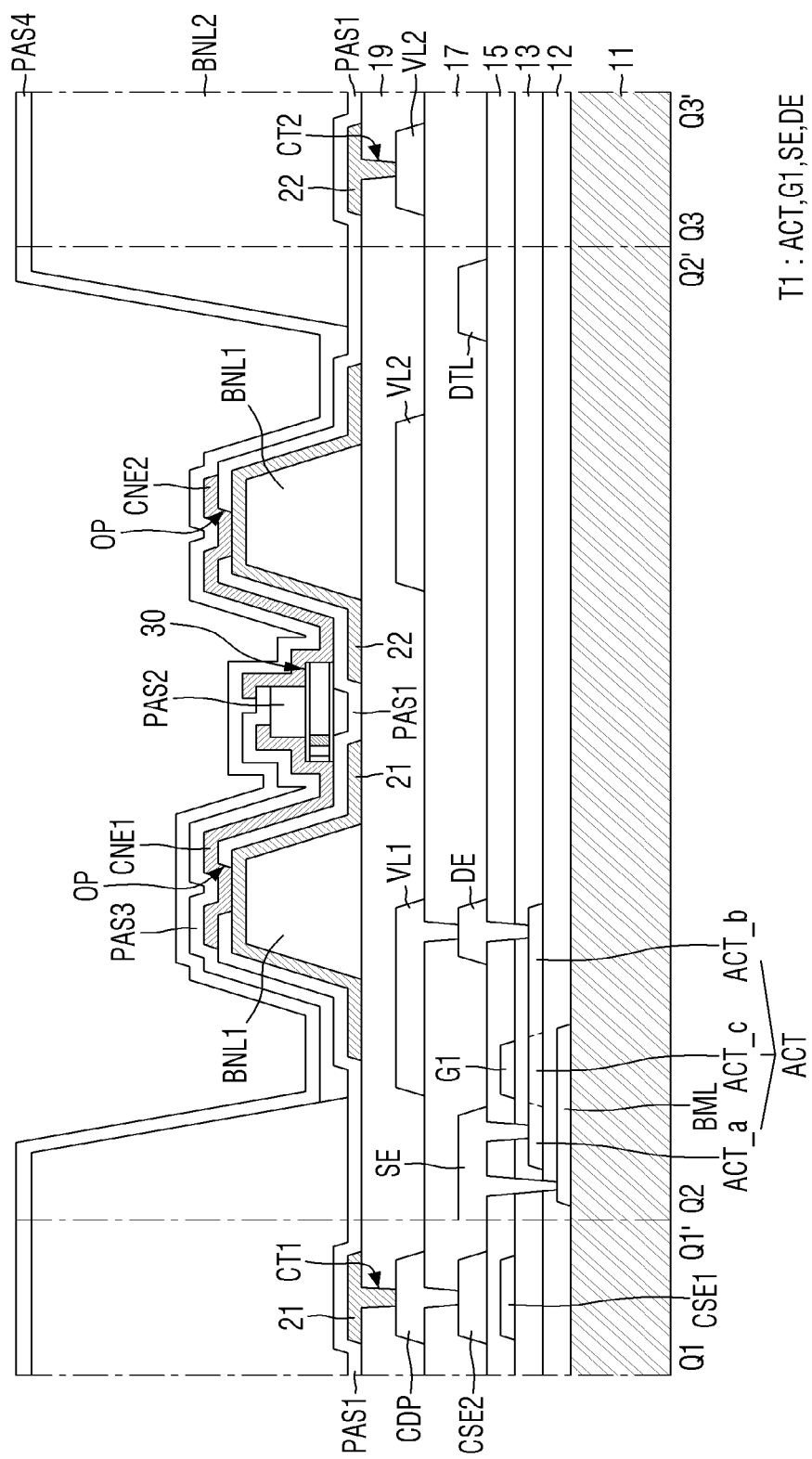
FIG. 4 is a schematic cross-sectional view taken along line Q1-Q1', line Q2-Q2', and line Q3-Q3' of FIG. 3.

FIG. 4 is a schematic cross-sectional view taken along line Q1-Q1', line Q2-Q2', and line Q3-Q3' of FIG. 3. FIG. 4 illustrates a cross-section of both end portions of the light emitting element 30 disposed in the first sub-pixel PX1 of FIG. 3.

Referring to FIG. 4 in conjunction with FIG. 3, the display device 10 may include the substrate 11 and a semiconductor layer, conductive layers, and insulating layers that may be disposed on the substrate 11. The semiconductor layer, the conductive layers, and the insulating layers may constitute a circuit layer and a light emitting element layer of the display device 10.

A light blocking layer BML may be disposed on the substrate 11. The light blocking layer BML may be disposed to overlap the active layer ACT of the first transistor T1 of the display device 10. The light blocking layer BML may include a material that blocks light and prevent light from being incident on the active layer ACT of the first transistor T1. For example, the light blocking layer BML may be made of an opaque metal material that blocks the transmission of light. However, the disclosure is not limited thereto, and the light blocking layer BML may be omitted in certain cases. The light blocking layer BML may be electrically connected to the source electrode SE to suppress a change in a voltage of a transistor. The light blocking layer BML may be used as a line, e.g., a power line, a data line, or a gate line.

The buffer layer 12 may include the light blocking layer BML and may be disposed on the entire area of the substrate 11. The buffer layer 12 may be formed on the substrate 11 to protect the first transistor T1 of each pixel PX from moisture permeating through the substrate 11, which may be vulnerable to moisture permeation, and may perform a surface planarization function. The buffer layer 12 may include inorganic layers that may be alternately stacked on each other. For example, the buffer layer 12 may include multiple layers formed by alternately stacking inorganic layers that include at least any one of silicon oxide ($SiO_x$), silicon nitride ($SiN_x$), and silicon oxynitride ($SiO_xN_y$).

The semiconductor layer may be disposed on the buffer layer 12. The semiconductor layer may include the active layer ACT of the first transistor T1. The semiconductor layer and the active layer ACT may be disposed to partially overlap the gate electrode G1 or the like of a first gate conductive layer which will be described below.

Although the drawings illustrate only the first transistor T1 of the transistors included in each sub-pixel PXn of the display device 10, the disclosure is not limited thereto. The display device 10 may include more transistors. For example, the display device 10 may further include one or more transistors in addition to the first transistor T1 included in each sub-pixel PXn and may include two or three transistors.

The semiconductor layer may include polycrystalline silicon, monocrystalline silicon, an oxide semiconductor, and the like, or a combination thereof. In a case in which the semiconductor layer includes an oxide semiconductor, each active layer ACT may include the conductive areas ACT_a and ACT_b and the channel area ACT_c therebetween. The oxide semiconductor may be an oxide semiconductor containing indium (In). For example, the oxide semiconductor may be indium-tin oxide (ITO), indium-zinc oxide (IZO), indium-gallium oxide (IGO), indium-zinc-tin oxide (IZTO), indium-gallium-tin oxide (IGTO), indium-gallium-zinc oxide (IGZO), indium-gallium-zinc-tin oxide (IGZTO), or the like, or a combination thereof.

In another embodiment, the semiconductor layer may include polycrystalline silicon. The polycrystalline silicon may be formed by crystallizing amorphous silicon, and in this case, each conductive area of the active layer ACT may be a doping area doped with an impurity.

The first gate insulating layer 13 may be disposed on the semiconductor layer and the buffer layer 12. The first gate insulating layer 13 may include the semiconductor layer and may be disposed on the buffer layer 12. The first gate insulating layer 13 may function as a gate insulating layer of each transistor. The first gate insulating layer 13 may include an inorganic layer including an inorganic material such as silicon oxide ($SiO_x$), silicon nitride ($SiN_x$), silicon oxynitride ($SiO_xN_y$), or a combination thereof, or may be formed of a structure in which the inorganic layer may be provided as inorganic layers and the inorganic layers may be stacked on each other.

The first gate conductive layer may be disposed on the first gate insulating layer 13. The first gate conductive layer may include the gate electrode G1 of the first transistor T1 and a first capacitive electrode CSE1 of a storage capacitor. The gate electrode G1 may be disposed to overlap the channel area ACT_c of the active layer ACT in the thickness direction. The first capacitive electrode CSE1 may be disposed to overlap a second capacitive electrode CSE2, which will be described below, in the thickness direction. In one embodiment, the first capacitive electrode CSE1 may be connected to the gate electrode G1 and integrally formed therewith. The first capacitive electrode CSE1 may be disposed to overlap the second capacitive electrode CSE2 in the thickness direction, and the storage capacitor may be formed therebetween.

The first gate conductive layer may include a single layer or multiple layers that include at least one of molybdenum (Mo), aluminum (Al), chromium (Cr), gold (Au), titanium (Ti), nickel (Ni), neodymium (Nd), and copper (Cu) or an alloy thereof. However, the disclosure is not limited thereto.

The first interlayer insulating layer 15 may be disposed on the first gate conductive layer. The first interlayer insulating layer 15 may serve as an insulating layer between the first gate conductive layer and other layers disposed thereon. The first interlayer insulating layer 15 may be disposed to cover the first gate conductive layer and may serve to protect the first gate conductive layer. The first interlayer insulating layer 15 may include an inorganic layer including an inorganic material such as silicon oxide ($SiO_x$), silicon nitride ($SiN_x$), silicon oxynitride ($SiO_xN_y$), or a combination thereof, or may be formed of a structure in which the inorganic layer may be provided as inorganic layers and the inorganic layers may be stacked on each other.

A first data conductive layer may be disposed on the first interlayer insulating layer 15. The first data conductive layer may include the source electrode SE and the drain electrode DE of the first transistor T1 and include a data line DTL and the second capacitive electrode CSE2.

The source electrode SE and the drain electrode DE of the first transistor T1 may respectively come in contact with the doped areas ACT_a and ACT_b of the active layer ACT through a contact hole that passes through the first interlayer insulating layer 15 and the first gate insulating layer 13. The source electrode SE of the first transistor T1 may be electrically connected to the light blocking layer BML through another contact hole.

The data line DTL may apply a data signal to another transistor (not illustrated) included in the display device 10. Although not illustrated in the drawings, the data line DTL may be connected to a source/drain electrode of another transistor and transmit a signal applied from the data line DTL thereto.

The second capacitive electrode CSE2 may be disposed to overlap the first capacitive electrode CSE1 in the thickness direction. In one embodiment, the second capacitive electrode CSE2 may be integrally formed with the source electrode SE and connected thereto.

The first data conductive layer may include a single layer or multiple layers that include at least one of molybdenum (Mo), aluminum (Al), chromium (Cr), gold (Au), titanium (Ti), nickel (Ni), neodymium (Nd), and copper (Cu) or an alloy thereof. However, the disclosure is not limited thereto.

The second interlayer insulating layer 17 may be disposed on the first data conductive layer. The second interlayer insulating layer 17 may serve as an insulating layer between the first data conductive layer and other layers disposed thereon. The second interlayer insulating layer 17 may cover the first data conductive layer and serve to protect the first data conductive layer. The second interlayer insulating layer 17 may include an inorganic layer including an inorganic material such as silicon oxide ($SiO_x$), silicon nitride ($SiN_x$), silicon oxynitride ($SiO_xN_y$), or a combination thereof, or may be formed of a structure in which the inorganic layer may be provided as inorganic layers and the inorganic layers may be stacked on each other.

A second data conductive layer may be disposed on the second interlayer insulating layer 17. The second data conductive layer may include a first voltage line VL1, a second voltage line VL2, and a first conductive pattern CDP. A high-potential voltage (or a first source voltage), which may be supplied to the first transistor T1, may be applied to the first voltage line VL1, and a low-potential voltage (or a second source voltage), which may be supplied to the second electrode 22, may be applied to the second voltage line VL2. During a process of manufacturing the display device 10, an alignment signal that may be necessary for aligning the light emitting elements 30 may also be applied to the second voltage line VL2.

The first conductive pattern CDP may be connected to the second capacitive electrode CSE2 through a contact hole formed in the second interlayer insulating layer 17. The second capacitive electrode CSE2 may be integrally formed with the source electrode SE of the first transistor T1, and the first conductive pattern CDP may be electrically connected with the source electrode SE. The first conductive pattern CDP may also come in contact with the first electrode 21 which will be described below, and the first transistor T1 may transmit the first source voltage applied from the first voltage line VL1 to the first electrode 21 through the first conductive pattern CDP. Although the drawings illustrate a case in which the second data conductive layer includes a single second voltage line VL2 and a single first voltage line VL1, the disclosure is not limited thereto. The second data conductive layer may include more first voltage lines VL1 and second voltage lines VL2. However, the disclosure is not limited thereto, and the first data conductive layer may also serve to transmit a signal such as a source voltage, and in this case, the second data conductive layer may be omitted.

The second data conductive layer may include a single layer or multiple layers that include at least one of molybdenum (Mo), aluminum (Al), chromium (Cr), gold (Au), titanium (Ti), nickel (Ni), neodymium (Nd), and copper (Cu) or an alloy thereof. However, the disclosure is not limited thereto.

The first planarization layer 19 may be disposed on the second data conductive layer. The first planarization layer 19 may include an organic insulating material, e.g., an organic material such as polyimide (PI), and may perform a surface planarization function.

First patterns BNL1, the electrodes 21 and 22, the light emitting element 30, connection electrodes CNE1 and CNE2, and the second pattern BNL2 may be disposed on the first planarization layer 19. Insulating layers PAS1, PAS2, PAS3, and PAS4 may be disposed on the first planarization layer 19.

The first patterns BNL1 may be disposed directly on the first planarization layer 19. The first patterns BNL1 may have a shape that extends in the second direction DR2 in each sub-pixel PXn but may not extend to another sub-pixel PXn that may be adjacent in the second direction DR2 and may be disposed in the light emitting area EMA. The first patterns BNL1 may be disposed to be spaced apart from each other in the first direction DR1, and the light emitting element 30 may be disposed therebetween. The first patterns BNL1 may be disposed in each sub-pixel PXn to form a linear pattern in the display area DPA of the display device 10. Although two first patterns BNL1 are illustrated in the drawings, the disclosure is not limited thereto. More first patterns BNL1 may be disposed according to the number of electrodes 21 and 22.

The first pattern BNL1 may have a structure in which at least a portion protrudes from an upper surface of the first planarization layer 19. The protruding portion of the first pattern BNL1 may have an inclined side surface, and light emitted from the light emitting element 30 may be reflected by the electrodes 21 and 22 disposed on the first pattern BNL1 and may be output in a direction upward from the first planarization layer 19. The first pattern BNL1 may simultaneously provide an area in which the light emitting element 30 may be disposed and serve as a reflective partition wall that reflects the light emitted from the light emitting element 30 upward. The side surface of the first pattern BNL1 may be inclined in a linear shape, but the disclosure is not limited thereto, and the first pattern BNL1 may have an outer surface formed in a semicircular or semielliptical shape that may be curved. The first patterns BNL1 may include an organic insulating material such as polyimide (PI), but the disclosure is not limited thereto.

The electrodes 21 and 22 may be disposed on the first pattern BNL1 and the first planarization layer 19. The electrodes 21 and 22 may include the first electrode 21 and the second electrode 22. The first electrode 21 and the second electrode 22 may extend in the second direction DR2 and may be disposed to be spaced apart from each other in the first direction DR1.

The first electrode 21 and the second electrode 22 may each extend in the second direction DR2 in the sub-pixel PXn and may be separated from other electrodes 21 and 22 in the cut portion area CBA. For example, the cut portion area CBA may be disposed between the light emitting areas EMA of the sub-pixels PXn that may be adjacent in the second direction DR2, and in the cut portion area CBA, the first electrode 21 and the second electrode 22 may be separated from other first electrodes 21 and second electrodes 22 disposed in the sub-pixels PXn that may be adjacent in the second direction DR2. However, the disclosure is not limited thereto, and certain of the electrodes 21 and 22 may be disposed to extend over the sub-pixel PXn adjacent in the second direction DR2 instead of being separated for each sub-pixel PXn, or only one of the first electrode 21 and the second electrode 22 may be separated.

The first electrode 21 may be electrically connected to the first transistor T1 through a first contact hole CT1, and the second electrode 22 may be electrically connected to the second voltage line VL2 through a second contact hole CT2. For example, the first electrode 21 may come in contact with the first conductive pattern CDP through the first contact hole CT1 that passes through the first planarization layer 19 in a portion of the second pattern BNL2 extending in the first direction DR1. The second electrode 22 may come in contact with the second voltage line VL2 through the second contact hole CT2 that passes through the first planarization layer 19 in the portion of the second pattern BNL2 extending in the first direction DR1. However, the disclosure is not limited thereto. In another embodiment, the first contact hole CT1 and the second contact hole CT2 may be disposed in the light emitting area EMA, which may be surrounded by the second pattern BNL2, so as not to overlap the second pattern BNL2. In still another embodiment, the second electrode 22 may come in direct contact with the first data conductive layer, and thus a voltage may be applied to the second electrode 22.

Although the drawings illustrate a case in which a single first electrode 21 and a single second electrode 22 may be disposed in each sub-pixel PXn, the disclosure is not limited thereto, and the number of first electrodes 21 and second electrodes 22 disposed in each sub-pixel PXn may be greater. The first electrode 21 and the second electrode 22 disposed in each sub-pixel PXn may not necessarily have a shape extending in one direction, and the first electrode 21 and the second electrode 22 may be disposed in various structures. For example, the first electrode 21 and the second electrode 22 may have a shape that may be partially curved or bent or may be disposed so that any one electrode surrounds the other electrode.

The first electrode 21 and the second electrode 22 may each be disposed directly on the first pattern BNL1. The first electrode 21 and the second electrode 22 may each be formed to have a width larger than that of the first pattern BNL1. For example, the first electrode 21 and the second electrode 22 may each be disposed to cover the outer surface of the first pattern BNL1. The first electrode 21 and the second electrode 22 may each be disposed on the side surface of the first pattern BNL1, and intervals between the first electrode 21 and the second electrode 22 may be smaller than intervals between the first patterns BNL1. At least certain areas of the first electrode 21 and the second electrode 22 may be disposed directly on the first planarization layer 19 and may be coplanar with each other. However, the disclosure is not limited thereto. In certain cases, a width of each of the electrodes 21 and 22 may be smaller than a width of the first pattern BNL1. However, each of the electrodes 21 and 22 may be disposed to cover at least one side surface of the first pattern BNL1 and reflect light emitted from the light emitting element 30.

Each of the electrodes 21 and 22 may include a conductive material with high reflectivity. For example, the material with high reflectivity of each of the electrodes 21 and 22 may include metals such as silver (Ag), copper (Cu), and aluminum (Al) or may be an alloy including aluminum (Al), nickel (Ni), lanthanum (La), and the like. Each of the electrodes 21 and 22 may reflect light, which may be emitted from the light emitting element 30 and advances toward the side surface of the first pattern BNL1, in a direction toward an upper portion of each sub-pixel PXn.

However, the disclosure is not limited thereto, and each of the electrodes 21 and 22 may further include a transparent conductive material. For example, each of the electrodes 21 and 22 may include materials such as indium tin oxide (ITO), indium zinc oxide (IZO), and indium tin-zinc oxide (ITZO). In certain embodiments, each of the electrodes 21 and 22 may have a structure in which one or more layers of the transparent conductive material and one or more layers of the metal material with high reflectivity may be stacked on each other, or each of the electrodes 21 and 22 may be formed as a single layer that includes the transparent conductive material and the metal material with high reflectivity. For example, each of the electrodes 21 and 22 may have a stacked structure of ITO/Ag/ITO, ITO/Ag/IZO, ITO/Ag/ITZO/IZO, or the like.

The electrodes 21 and 22 may be electrically connected to the light emitting elements 30, and a predetermined voltage may be applied to the electrodes 21 and 22 so that the light emitting elements 30 emit light. The electrodes 21 and 22 may be electrically connected to the light emitting elements 30 through the connection electrodes CNE1 and CNE2 and may transmit an electrical signal applied to the electrodes 21 and 22 to the light emitting elements 30 through the connection electrodes CNE1 and CNE2.

Any one of the first electrode 21 and the second electrode 22 may be electrically connected to an anode electrode of the light emitting element 30, and the other one thereof may be electrically connected to a cathode electrode of the light emitting element 30. However, the disclosure is not limited thereto, and it may also be the other way around.

Each of the electrodes 21 and 22 may also be utilized in forming an electric field in the sub-pixel PXn to align the light emitting elements 30. The light emitting elements 30 may be disposed between the first electrode 21 and the second electrode 22 due to an electric field formed on the first electrode 21 and the second electrode 22. The light emitting elements 30 of the display device 10 may be ejected onto the electrodes 21 and 22 through an inkjet printing process. When an ink including the light emitting elements 30 may be ejected onto the electrodes 21 and 22, an alignment signal may be applied to the electrodes 21 and 22 to generate an electric field. The light emitting elements 30 dispersed in the ink may receive a dielectrophoretic force due to the electric field generated on the electrodes 21 and 22 and may be aligned on the electrodes 21 and 22.

The first insulating layer PAS1 may be disposed on the first planarization layer 19. The first insulating layer PAS1 may be disposed to cover the first patterns BNL1 and the first electrodes 21 and second electrodes 22. The first insulating layer PAS1 may simultaneously protect the first electrode 21 and the second electrode 22 and insulate the first electrode 21 and the second electrode 22 from each other. The first insulating layer PAS1 may prevent the light emitting element 30 disposed on the first insulating layer PAS1 from being damaged due to coming in direct contact with other members.

In one embodiment, the first insulating layer PAS1 may include openings OP that partially expose the first electrode 21 and the second electrode 22. Each opening OP may partially expose a portion of each of the electrodes 21 and 22 that may be disposed on the upper surface of the first pattern BNL1. A portion of the connection electrodes CNE1 and CNE2 may come in contact with each of the electrodes 21 and 22 exposed through the opening OP.

The first insulating layer PAS1 may have a step formed so that a portion of an upper surface may be recessed between the first electrode 21 and the second electrode 22. For example, since the first insulating layer PAS1 may be disposed to cover the first electrode 21 and the second electrode 22, the upper surface of the first insulating layer PAS1 may be stepped along the shapes of the electrodes 21 and 22 disposed therebelow. However, the disclosure is not limited thereto.

The second pattern BNL2 may be disposed on the first insulating layer PAS1. In the plan view, the second pattern BNL2 may include portions extending in the first direction DR1 and the second direction DR2 and may be disposed as a grid pattern on the entire surface of the display area DPA. The second pattern BNL2 may be disposed across boundaries of the sub-pixels PXn to differentiate adjacent sub-pixels PXn.

The second pattern BNL2 may be disposed to surround the light emitting area EMA and the cut portion area CBA, which may be disposed in each sub-pixel PXn, to differentiate the light emitting area EMA and the cut portion area CBA. The first electrode 21 and the second electrode 22 may extend in the second direction DR2 and may be disposed across the portion of the second pattern BNL2 extending in the first direction DR1. The portion of the second pattern BNL2 extending in the second direction DR2, which may be the portion disposed between the light emitting areas EMA, may have a width larger than that of the portion disposed between the cut portion areas CBA. Accordingly, intervals between the cut portion areas CBA may be smaller than intervals between the light emitting areas EMA.

The second pattern BNL2 may be formed to have a height greater than that of the first pattern BNL1. The second pattern BNL2 may separate the sub-pixels PXn from each other so that, in the inkjet printing process of a process of manufacturing the display device 10, an ink in one sub-pixel PXn may be prevented from overflowing to another sub-pixel PXn adjacent thereto and inks in different sub-pixels PXn in which different light emitting elements 30 may be dispersed may not be mixed with each other. The second pattern BNL2 may include polyimide (PI) like the first pattern BNL1, but the disclosure is not limited thereto.

The light emitting element 30 may be disposed on the first insulating layer PAS1. The light emitting elements 30 may be disposed to be spaced apart from each other in the second direction DR2, in which each of the electrodes 21 and 22 extends, and may be aligned to be substantially parallel to each other. The light emitting element 30 may have a shape extending in one direction, and the direction in which each of the electrodes 21 and 22 extends may be substantially perpendicular to the direction in which the light emitting element 30 extends. However, the disclosure is not limited thereto, and the light emitting element 30 may be disposed at an angle from the direction in which each of the electrodes 21 and 22 extends instead of being disposed to be perpendicular thereto.

The light emitting elements 30 disposed in each sub-pixel PXn may include light emitting layers 36 (see FIG. 5) including different materials and may emit light in different wavelength bands to the outside. Accordingly, light of a first color, light of a second color, and light of a third color may be output from the first sub-pixel PX1, the second sub-pixel PX2, and the third sub-pixel PX3, respectively. However, the disclosure is not limited thereto, and the sub-pixels PXn may include the light emitting elements 30 of the same type and may emit light of substantially the same color.

Both end portions of the light emitting element 30 may be disposed on each of the electrodes 21 and 22 between the first patterns BNL1. A length at which the light emitting element 30 extends may be larger than a gap between the first electrode 21 and the second electrode 22, and both end portions of the light emitting element 30 may be disposed on the first electrode 21 and the second electrode 22, respectively. For example, an end portion of the light emitting element 30 may be placed on the first electrode 21, and another end portion of the light emitting element 30 may be placed on the second electrode 22.

In a light emitting element 30, layers may be disposed in a direction perpendicular to the substrate 11 or the upper surface of the first planarization layer 19. The light emitting element 30 may be disposed so that a direction in which the light emitting element 30 extends may be parallel to the upper surface of the first planarization layer 19, and semiconductor layers included in the light emitting element 30 may be sequentially disposed in a direction parallel to the upper surface of the first planarization layer 19. However, the disclosure is not limited thereto, and in a case in which the light emitting element 30 has another structure, the semiconductor layers may be disposed in a direction perpendicular to the upper surface of the first planarization layer 19.

Both end portions of the light emitting element 30 may come in contact with the connection electrodes CNE1 and CNE2, respectively. For example, on an end surface of the light emitting element 30 in a direction in which the light emitting element 30 extends, an insulating film 38 (see FIG. 5) may not be formed and semiconductor layers 31 and 32 (see FIG. 5) or an electrode layer 37 (see FIG. 5) may be partially exposed, and the exposed semiconductor layers 31 and 32 (see FIG. 5) or the exposed electrode layer 37 (see FIG. 5) may come in contact with the connection electrodes CNE1 and CNE2. However, the disclosure is not limited thereto, and in the light emitting element 30, at least a partial area of the insulating film 38 may be removed, and side surfaces of both end portions of the semiconductor layers 31 and 32 (see FIG. 5) may be partially exposed. The exposed side surfaces of the semiconductor layers 31 and 32 (see FIG. 5) may also come in direct contact with the connection electrodes CNE1 and CNE2.

The second insulating layer PAS2 may be partially disposed on the light emitting element 30. For example, the second insulating layer PAS2 may have a width smaller than a length of the light emitting element 30 and may be disposed on the light emitting element 30 so that both end portions of the light emitting element 30 may be exposed when the second insulating layer PAS2 surrounds the light emitting element 30. During the process of manufacturing the display device 10, the second insulating layer PAS2 may be disposed to cover the light emitting element 30, the electrodes 21 and 22, and the first insulating layer PAS1 and then be removed so that both end portions of the light emitting element 30 may be exposed. In the plan view, the second insulating layer PAS2 may be disposed to extend in the second direction DR2 on the first insulating layer PAS1 to form a linear or isolated pattern (e.g., island pattern) in each sub-pixel PXn. The second insulating layer PAS2 may simultaneously protect the light emitting element 30 and fix the light emitting element 30 in the process of manufacturing the display device 10.

The connection electrodes CNE1 and CNE2 and the third insulating layer PAS3 may be disposed on the second insulating layer PAS2.

The connection electrodes CNE1 and CNE2 may have a shape extending in one direction and may be disposed on each of the electrodes 21 and 22. The connection electrodes CNE1 and CNE2 may include a first connection electrode CNE1 disposed on the first electrode 21 and a second connection electrode CNE2 disposed on the second electrode 22. The connection electrodes CNE1 and CNE2 may be disposed to be spaced apart from each other or to be opposite to each other. For example, the first connection electrode CNE1 and the second connection electrode CNE2 may be disposed on the first electrode 21 and the second electrode 22, respectively, and may be spaced apart from each other in the first direction DR1. The connection electrodes CNE1 and CNE2 may form a stripe pattern in the light emitting area EMA of each sub-pixel PXn.

The connection electrodes CNE1 and CNE2 may each come in contact with the light emitting element 30. The first connection electrode CNE1 may come in contact with an end portion of the light emitting element 30, and the second connection electrode CNE2 may come in contact with another end portion of the light emitting element 30. The semiconductor layer may be exposed through both end surfaces of the light emitting element 30 in the direction in which the light emitting element 30 extends, and each of the connection electrodes CNE1 and CNE2 may come in contact with the semiconductor layer of the light emitting element 30 and be electrically connected thereto. A side of each of the connection electrodes CNE1 and CNE2 that comes in contact with both end portions of the light emitting element 30 may be disposed on the second insulating layer PAS2. The first connection electrode CNE1 may come in contact with the first electrode 21 through the opening OP through which a portion of the upper surface of the first electrode 21 may be exposed, and the second connection electrode CNE2 may come in contact with the second electrode 22 through the opening OP through which a portion of the upper surface of the second electrode 22 may be exposed.

A width of each of the connection electrodes CNE1 and CNE2 that may be measured in a direction may be smaller than a width of each of the electrodes 21 and 22 measured in the direction. Each of the connection electrodes CNE1 and CNE2 may be disposed to simultaneously come in contact with an end portion and another end portion of the light emitting element 30 and cover the portions of the upper surfaces of the first electrode 21 and the second electrode 22. However, the disclosure is not limited thereto, and the width of each of the connection electrodes CNE1 and CNE2 may be formed to be larger than the width of each of the electrodes 21 and 22, and thus the connection electrodes CNE1 and CNE2 may cover both sides of the electrodes 21 and 22.

The connection electrodes CNE1 and CNE2 may include a transparent conductive material. For example, the connection electrodes CNE1 and CNE2 may include ITO, IZO, ITZO, aluminum (Al), and the like, or a combination thereof. Light emitted from the light emitting element 30 may pass through the connection electrodes CNE1 and CNE2 and advance toward the electrodes 21 and 22. However, the disclosure is not limited thereto.

Although the drawings illustrate a case in which two connection electrodes CNE1 and CNE2 may be disposed in a single sub-pixel PXn, the disclosure is not limited thereto. The number of each of the connection electrodes CNE1 and CNE2 may be changed according to the number of electrodes 21 and 22 disposed in each sub-pixel PXn.

The third insulating layer PAS3 may be disposed to cover the first connection electrode CNE1. The third insulating layer PAS3 may include the first connection electrode CNE1 and may be disposed to cover one side on which the first connection electrode CNE1 may be disposed based on the second insulating layer PAS2. For example, the third insulating layer PAS3 may be disposed to cover the first connection electrode CNE1 and the first insulating layer PAS1 disposed on the first electrode 21. The arrangement may be formed by a process in which an insulating material layer constituting the third insulating layer PAS3 may be arranged on the entire area of the light emitting area EMA and then the insulating material layer may be partially removed to form the second connection electrode CNE2. In the process, the insulating material layer constituting the third insulating layer PAS3 may be removed along with an insulating material layer constituting the second insulating layer PAS2, and a side of the third insulating layer PAS3 and a side of the second insulating layer PAS2 may be aligned with each other. The second connection electrode CNE2 may have a side disposed on the third insulating layer PAS3 and may be insulated from the first connection electrode CNE1 while the third insulating layer PAS3 may be disposed therebetween.

The fourth insulating layer PAS4 may be disposed on the entire area of the display area DPA of the substrate 11. The fourth insulating layer PAS4 may serve to protect members disposed on the substrate 11 from an external environment. However, the fourth insulating layer PAS4 may also be omitted.

Each of the first insulating layer PAS1, the second insulating layer PAS2, the third insulating layer PAS3, and the fourth insulating layer PAS4 may include an inorganic insulating material or an organic insulating material. For example, the first insulating layer PAS1, the second insulating layer PAS2, the third insulating layer PAS3, and the fourth insulating layer PAS4 may include an inorganic insulating material such as silicon oxide ($SiO_x$), silicon nitride ($SiN_x$), silicon oxynitride ($SiO_xN_y$), aluminum oxide ($Al_xO_y$), aluminum nitride (AlN), or a combination thereof.

Alternatively, the first insulating layer PAS1, the second insulating layer PAS2, the third insulating layer PAS3, and the fourth insulating layer PAS4 may include an organic insulating material such as an acrylic resin, an epoxy resin, a phenolic resin, a polyamide resin, a polyimide (PI) resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, a polymethyl methacrylate-polycarbonate synthetic resin, or a combination thereof. However, the disclosure is not limited thereto.

Figure 5:
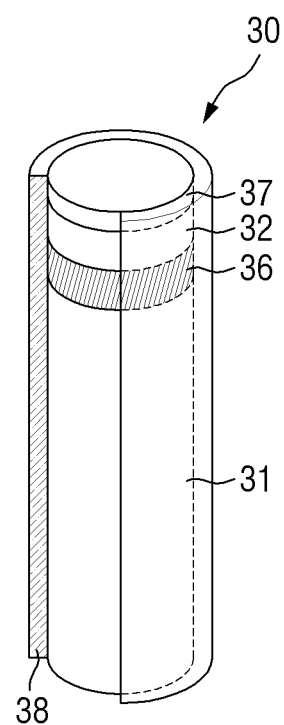
FIG. 5 is a schematic view of a light emitting element according to an embodiment.

FIG. 5 is a schematic view of a light emitting element according to an embodiment.

Referring to FIG. 5, the light emitting element 30 may be a particulate element and may have a rod-like or cylindrical shape that has a predetermined aspect ratio. The light emitting element 30 may have a nanometer scale size (about 1 nm or more and less than about 1 μm) or a micrometer scale size (about 1 μm or more and less than about 1 mm). In one embodiment, both a diameter and a length of the light emitting element 30 may be nanometer scale or micrometer scale. In certain other embodiments, while the diameter of the light emitting element 30 may be nanometer scale, the length of the light emitting element 30 may be micrometer scale. In certain embodiments, while the diameter and/or length of certain light emitting elements 30 may be nanometer scale, the diameter and/or length of other light emitting elements 30 may be micrometer scale.

In an embodiment, the light emitting element 30 may be an inorganic LED. Specifically, the light emitting element 30 may include a semiconductor layer doped with an arbitrary conductive (for example, p-type or n-type) impurity. The semiconductor layer may receive an electrical signal applied from an external power source and emit the received electrical signal as light in a specific wavelength band.

The light emitting element 30 according to an embodiment may include a first semiconductor layer 31, a light emitting layer (e.g., an active layer) 36, a second semiconductor layer 32, and an electrode layer 37 that may be sequentially stacked in a longitudinal direction. The light emitting element may further include the insulating film 38 that surrounds outer surfaces of the first semiconductor layer 31, the second semiconductor layer 32, and the active layer 36.

The first semiconductor layer 31 may be an n-type semiconductor. In a case in which the light emitting element 30 emits light in the blue wavelength band, the first semiconductor layer 31 may include a semiconductor material that has the chemical formula, $Al_xGa_yIn_{1-x-y}N$ (where $0 \le x \le 1$, $0 \le y \le 1$, and $0 \le x+y \le 1$). For example, the semiconductor material may be any one or more of AlGaInN, GaN, AlGaN, InGaN, AlN, and InN that may be doped with an n-type impurity. The first semiconductor layer 31 may be doped with an n-type dopant, and the n-type dopant may be Si, Ge, Sn, or the like. For example, the first semiconductor layer 31 may be n-GaN that may be doped with n-type Si. A length of the first semiconductor layer 31 may be in a range of about 1.5 μm to about 5 μm, but the disclosure is not limited thereto.

The second semiconductor layer 32 may be disposed on the light emitting layer 36 which will be described below. The second semiconductor layer 32 may be a p-type semiconductor, and in a case in which the light emitting element 30 emits light in the blue or green wavelength band, the second semiconductor layer 32 may include a semiconductor material that has the chemical formula, $Al_xGa_yIn_{1-x-y}N$ (where $0 \le x \le 1$, $0 \le y \le 1$, and $0 \le x+y \le 1$). For example, the semiconductor material may be any one or more of AlGaInN, GaN, AlGaN, InGaN, AlN, and InN that may be doped with a p-type impurity. The second semiconductor layer 32 may be doped with a p-type dopant, and the p-type dopant may be Mg, Zn, Ca, Se, Ba, or the like. For example, the second semiconductor layer 32 may be p-GaN that may be doped with p-type Mg. A length of the second semiconductor layer 32 may be in a range of about 0.05 μm to about 0.10 μm, but the disclosure is not limited thereto.

Although the drawings illustrate a case in which the first semiconductor layer 31 and the second semiconductor layer 32 may be each configured as a single layer, the disclosure is not limited thereto. The first semiconductor layer 31 and the second semiconductor layer 32 may have more than one layer according to the material of the light emitting layer 36. For example, the first semiconductor layer 31 and the second semiconductor layer 32 may each further include a clad layer or a tensile strain barrier reducing (TSBR) layer.

The light emitting layer 36 may be disposed between the first semiconductor layer 31 and the second semiconductor layer 32. The light emitting layer 36 may include a material having a single quantum well structure or a material having a multiple quantum well structure. In a case in which the light emitting layer 36 includes the material having the multiple quantum well structure, quantum layers and well layers may be alternately stacked in the structure. The light emitting layer 36 may emit light due to combination of electron-hole pairs according to an electrical signal applied through the first semiconductor layer 31 and the second semiconductor layer 32. In a case in which the light emitting layer 36 emits light in the blue wavelength band, the light emitting layer 36 may include materials such as AlGaN and AlGaInN. In particular, in a case in which the light emitting layer 36 has the multiple quantum well structure in which the quantum layers and the well layers may be alternately stacked, the quantum layer may include a material such as AlGaN or AlGaInN, and the well layer may include a material such as GaN or AlInN. For example, the quantum layer may include AlGaInN and the well layer may include AlInN, and as described above, the light emitting layer 36 may emit blue light of which a wavelength is in a range of about 450 nm to about 495 nm.

However, the disclosure is not limited thereto, and the light emitting layer 36 may have a structure in which semiconductor materials with high bandgap energy and semiconductor materials with low bandgap energy may be alternately stacked or may include different group III-V semiconductor materials according to a wavelength band of light being emitted. The light emitted by the light emitting layer 36 is not limited to light in the blue wavelength band, and the light emitting layer 36 may also emit light in the red or green wavelength band in certain cases. A length of the light emitting layer 36 may be in a range of about 0.05 μm to about 0.10 μm, but the disclosure is not limited thereto.

Light emitted from the light emitting layer 36 may not only be emitted to an outer surface of the light emitting element 30 in the longitudinal direction but also be emitted to both side surfaces of the light emitting element 30. The directivity of light emitted from the light emitting layer 36 is not limited to one direction.

The electrode layer 37 may be an ohmic connection electrode. However, the disclosure is not limited thereto, and the electrode layer 37 may also be a Schottky connection electrode. The light emitting element 30 may include at least one electrode layer 37. Although FIG. 4 illustrates a case in which the light emitting element 30 includes a single electrode layer 37, the disclosure is not limited thereto. In certain cases, the light emitting element 30 may include more electrode layers 37, or the electrode layer 37 may be omitted. The following description of the light emitting element 30 may be identically applied even when the number of electrode layers 37 may be changed or the light emitting element 30 further includes other structures.

The electrode layer 37 may, when the light emitting element 30 may be electrically connected to an electrode or a connection electrode in the display device 10 according to an embodiment, reduce resistance between the light emitting element 30 and the electrode or connection electrode. The electrode layer 37 may include a conductive metal. For example, the electrode layer 37 may include at least any one of aluminum (Al), titanium (Ti), indium (In), gold (Au), silver (Ag), indium tin oxide (ITO), indium zinc oxide (IZO), and indium tin-zinc oxide (ITZO). The electrode layer 37 may include a semiconductor material doped with an n-type or p-type impurity. The electrode layers 37 of different light emitting elements 30 may include the same material or include different materials, but the disclosure is not limited thereto.

The insulating film 38 may be disposed to surround the semiconductor layers and electrode layers. For example, the insulating film 38 may be disposed to surround at least an outer surface of the light emitting layer 36 and may extend in one direction in which the light emitting element 30 extends. The insulating film 38 may serve to protect the above members. The insulating film 38 may be formed to surround side surface portions of the members and may be formed so that both end portions of the light emitting element 30 in the longitudinal direction may be exposed.

Although the drawings illustrate a case in which the insulating film 38 may be formed to extend in the longitudinal direction of the light emitting element 30 and to cover from the first semiconductor layer 31 to the side surface of the electrode layer 37, the disclosure is not limited thereto. The insulating film 38 may cover only a portion of an outer surface of the semiconductor layer including the light emitting layer 36 or may cover only a portion of an outer surface of the electrode layer 37 so that the outer surface of the electrode layer 37 may be partially exposed. In a cross-sectional view, the insulating film 38 may be formed to have a round upper surface in an area adjacent to at least one end portion of the light emitting element 30.

A thickness of the insulating film 38 may be in a range of about 10 nm to about 1.0 μm, but the disclosure is not limited thereto. For example, the thickness of the insulating film 38 may be around 40 nm.

The insulating film 38 may include materials having an insulating characteristic, e.g., silicon oxide ($SiO_x$), silicon nitride ($SiN_x$), silicon oxynitride ($SiO_xN_y$), aluminum nitride (AlN), aluminum oxide ($Al_xO_y$), and the like, or a combination thereof. The insulating film 38 may be formed of a single film or multiple films made of the materials having the insulating characteristic. Accordingly, the insulating film 38 may prevent the electrical short circuit that may occur in a case in which the light emitting layer 36 comes in direct contact with an electrode of the light emitting element 30 to which an electrical signal may be transmitted. Since the insulating film 38 protects the outer surface of the light emitting element 30 including the light emitting layer 36, the insulating film 38 may prevent the degradation of light emitting efficiency.

An outer surface of the insulating film 38 may be surface-treated. The light emitting elements 30 dispersed in a predetermined ink may be ejected onto an electrode and aligned thereon. Here, in order to maintain a state in which the light emitting elements 30 may be dispersed in the ink without aggregating with other adjacent light emitting elements 30 in the ink, the surface of the insulating film 38 may be treated to be hydrophobic or hydrophilic. For example, the outer surface of the insulating film 38 may be surface-treated with materials such as stearic acid and 2,3-naphthalene dicarboxylic acid.

In the display device 10, the light emitting elements 30 dispersed in a predetermined ink may be ejected onto the substrate 11 and aligned thereon. The ink may be supplied through an inlet of a print head unit and dispersed through nozzles, and then the residual ink may be circulated through an outlet. However, when a nozzle may be clogged due to the light emitting elements being accumulated in a chamber at an upper portion of the nozzle, ink may not be discharged. The non-discharge of ink may be visible as stains on the display device and degrade the display quality.

Hereinafter, an inkjet printing device capable of removing light emitting elements accumulated in a chamber of a print head unit to address clogging of nozzles will be described.

Figure 6:
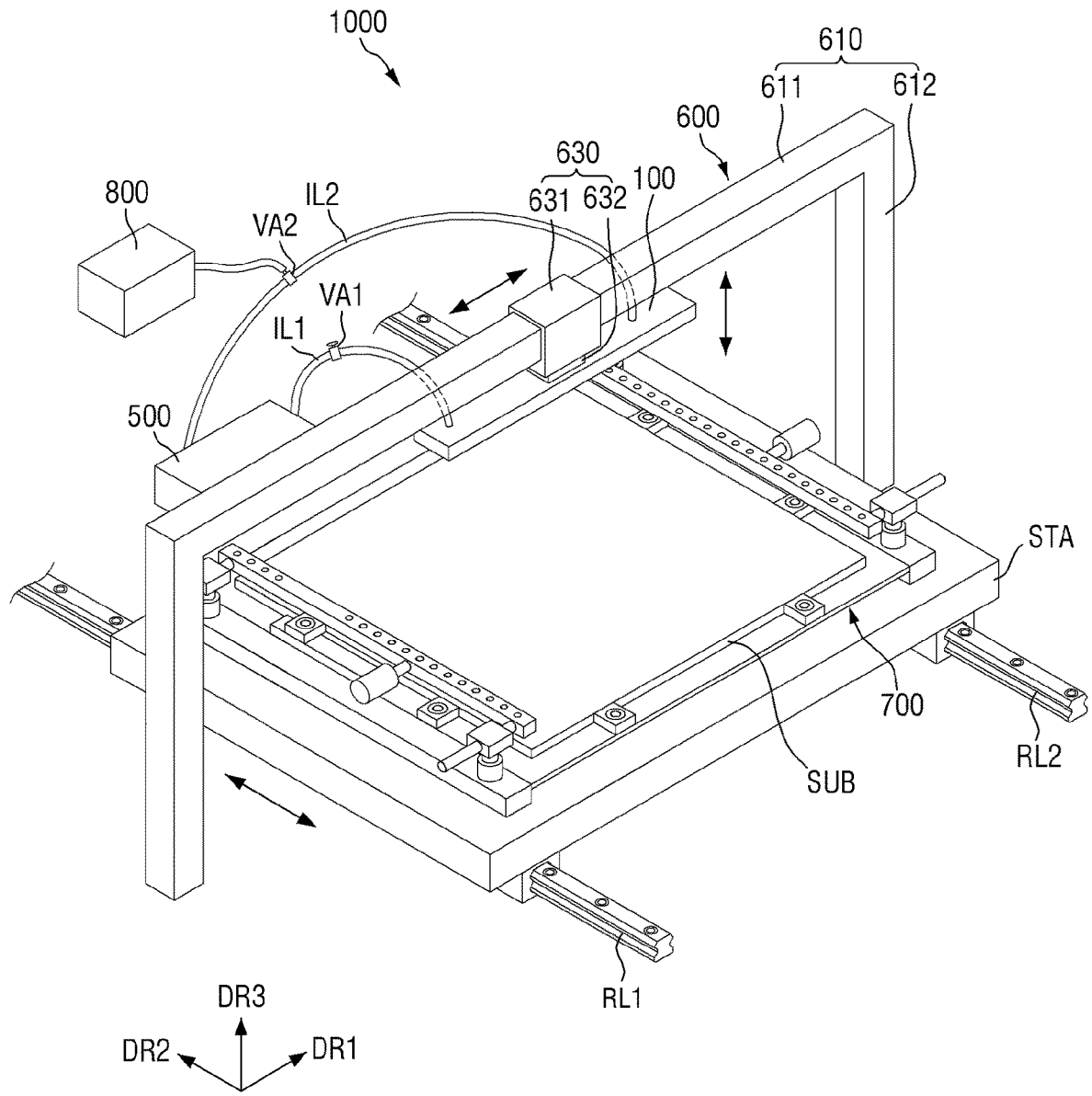
FIG. 6 is a schematic perspective view of an inkjet printing device according to an embodiment.
Figure 7:
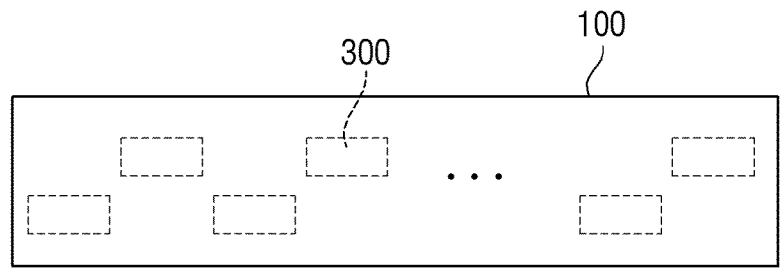
FIG. 7 is a schematic bottom view of a print head unit according to an embodiment.
Figure 7:
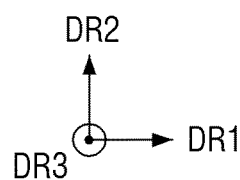
Figure 8:
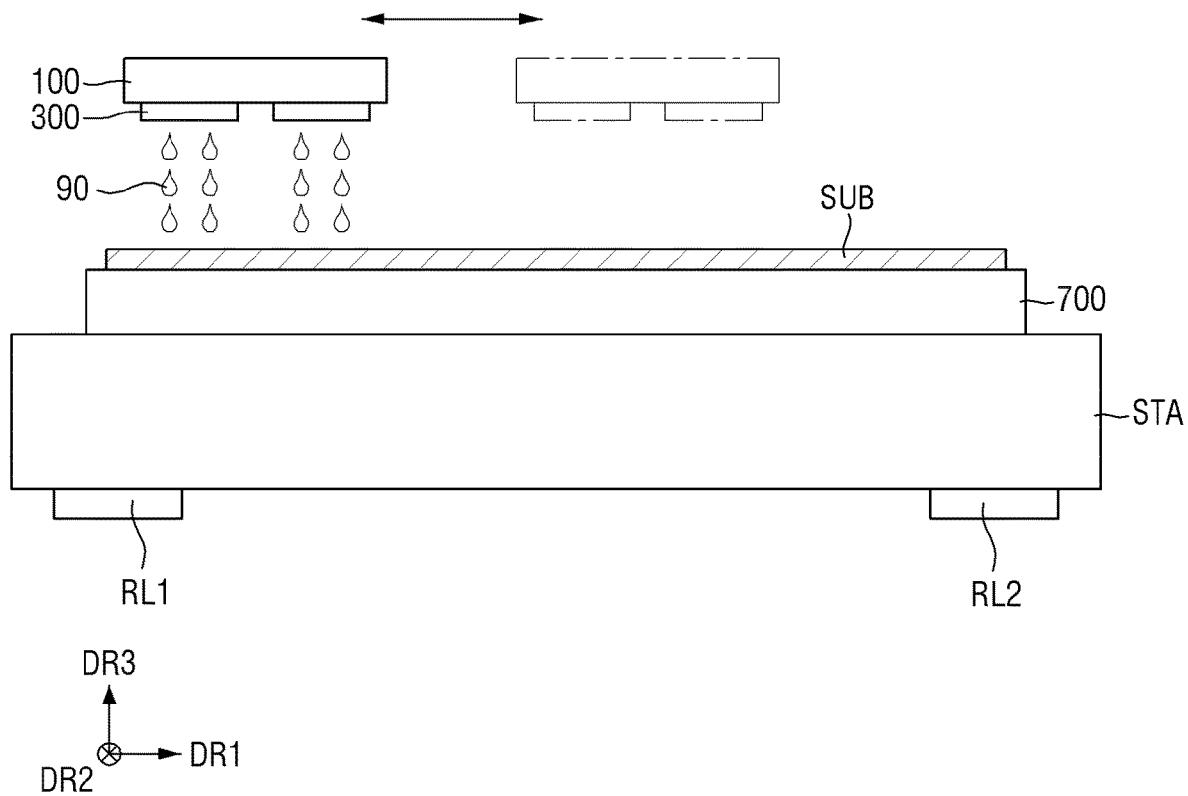
FIG. 8 is a schematic view illustrating the operation of the print head unit according to an embodiment.
Figure 9:
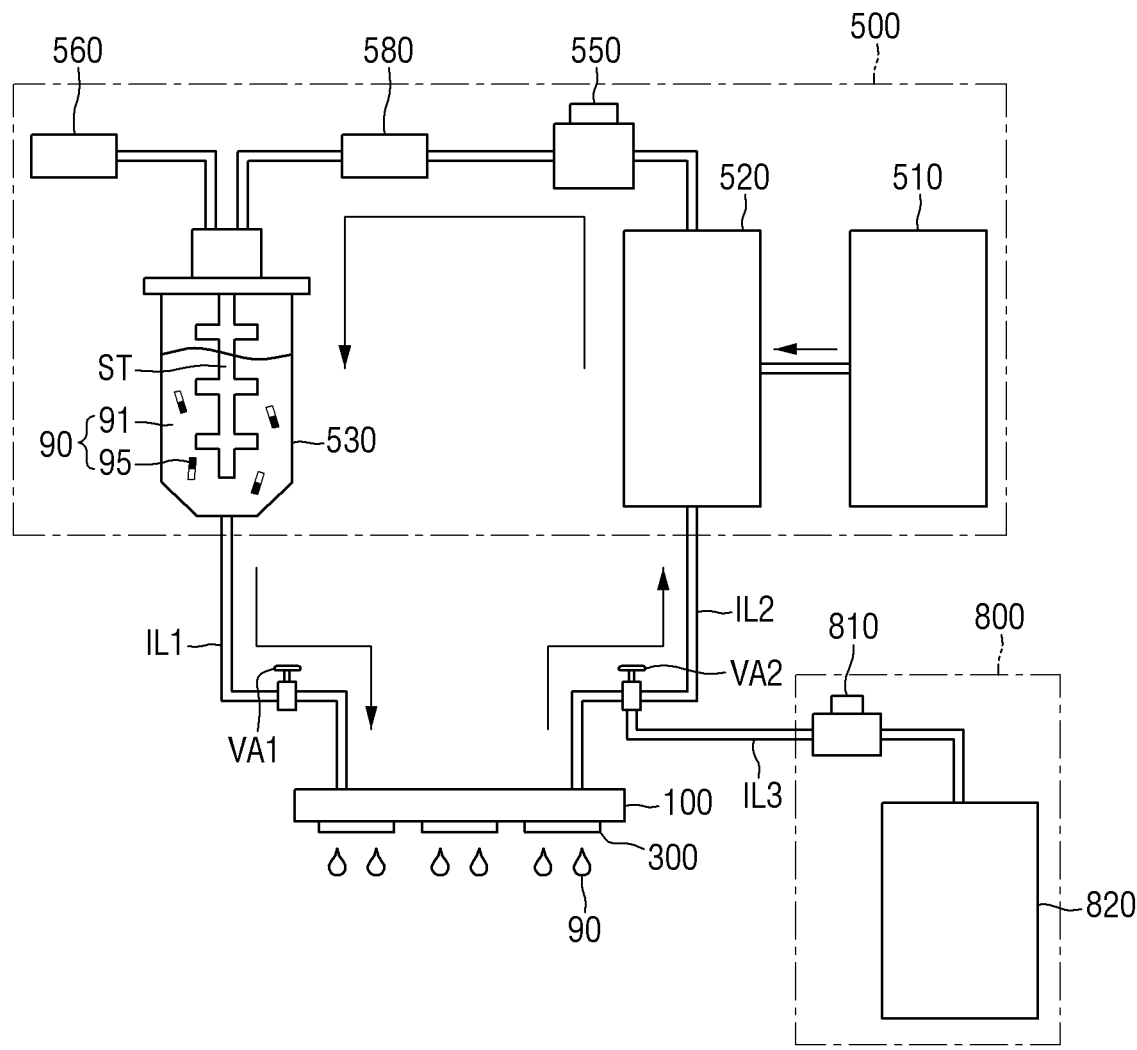
FIG. 9 is a schematic view illustrating an ink circulating part, a suctioning part, and the print head unit according to an embodiment.
Figure 10:
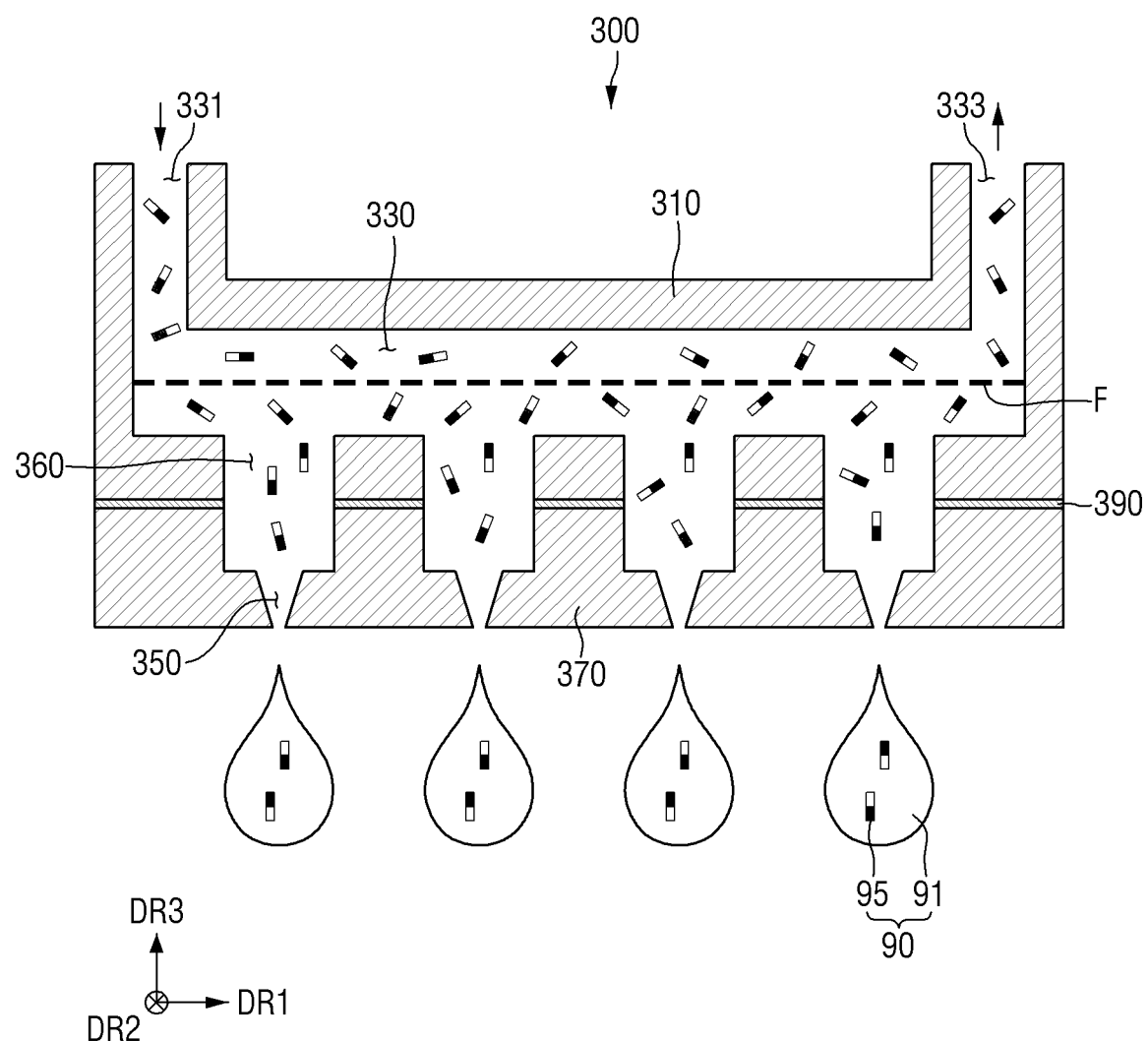
FIG. 10 is a schematic cross-sectional view of an inkjet head according to an embodiment.

FIG. 6 is a schematic perspective view of an inkjet printing device according to an embodiment. FIG. 7 is a schematic bottom view of a print head unit according to an embodiment. FIG. 8 is a schematic view illustrating the operation of the print head unit according to an embodiment. FIG. 9 is a schematic view illustrating an ink circulating part, a suctioning part, and the print head unit according to an embodiment. FIG. 10 is a schematic cross-sectional view of an inkjet head according to an embodiment. Here, FIG. 6 illustrates the shape of a print head unit 100 and a probe device 700 disposed on a stage STA according to an embodiment that may be viewed from the front.

Referring to FIGS. 6 to 9, an inkjet printing device 1000 according to an embodiment may include the print head unit 100 including inkjet heads 300. The inkjet printing device 1000 may further include the stage STA, an ink circulating part 500, a suctioning part 800, the probe device 700, and a base frame 600.

The inkjet printing device 1000 may use the print head unit 100 to eject a predetermined ink 90 onto a target substrate SUB. An electric field may be generated on the target substrate SUB, onto which the ink 90 may be ejected, due to the probe device 700, and particles, such as light emitting elements, included in the ink 90 may be aligned on the target substrate SUB.

The target substrate SUB may be provided on the probe device 700, the probe device 700 may form an electric field on the target substrate SUB, and the electric field may be transmitted to the ink 90 ejected onto the target substrate SUB. The particles such as light emitting elements 95 included in the ink 90 may have a shape extending in a direction, and due to the electric field, directions in which light emitting elements 95 extend may be aligned in a direction.

The stage STA may provide an area on which the probe device 700 may be disposed. The inkjet printing device 1000 may include a first rail RL1 and a second rail RL2 that extend in the second direction DR2, and the stage STA may be disposed on the first rail RL1 and the second rail RL2. The stage STA may move on the first rail RL1 and the second rail RL2 in the second direction DR2 due to a separate moving member. The probe device 700 may move in the second direction DR2 along with the stage STA, and as the probe device 700 passes through the print head unit 100, the ink 90 may be ejected thereon. However, the disclosure is not limited thereto. Although the drawings illustrate a structure in which the stage STA moves, in certain embodiments, the stage STA may be fixed and the print head unit 100 may move. In this case, the print head unit 100 may be mounted on a frame disposed on the first rail RL1 and the second rail RL2.

The print head unit 100 may include the inkjet heads 300 and may be disposed on the base frame 600. The print head unit 100 may use the inkjet heads 300, which may be connected to a separate ink storage part, to eject the predetermined ink 90 on the target substrate SUB provided on the probe device 700.

The base frame 600 may include a support part 610 and a moving unit 630. The support part 610 may include a first support part 611 that extends in the first direction DR1, which may be a horizontal direction, and a second support part 612 that may be extend to (e.g., connected to) the first support part 611 and extends in the third direction DR3, which may be a vertical direction. A direction in which the first support part 611 extends and the first direction DR1 may be a same direction, which may be a long-side direction of the probe device 700. The print head unit 100 may be disposed on the moving unit 630 mounted on the first support part 611.

The moving unit 630 may include a moving part 631 that may be mounted on the first support part 611 and may be able to move in one direction and a fixed part 632 that may be disposed on a lower surface of the moving part 631 and on which the print head unit 100 may be disposed. The moving part 631 may move in the first direction DR1 on the first support part 611, and the print head unit 100 may be fixed to the fixed part 632 and may move in the first direction DR1 along with the moving part 631.

The print head unit 100 may be disposed on the base frame 600 and may eject the ink 90 provided from an ink reservoir onto the target substrate SUB through the inkjet heads 300. The print head unit 100 may be spaced a specific distance apart from the stage STA that passes below the base frame 600. The distance at which the print head unit 100 may be spaced apart from the stage STA may be adjusted by a height of the second support part 612 of the base frame 600. The separation distance between the print head unit 100 and the stage STA may be adjusted within a range in which, when the probe device 700 and the target substrate SUB are disposed on the stage STA, the print head unit 100 may be spaced a certain distance apart from the target substrate SUB so that a space required for the printing process may be secured.

According to an embodiment, the print head unit 100 may include the inkjet heads 300 each including nozzles 350. The inkjet heads 300 may be disposed on a lower surface of the print head unit 100.

The inkjet heads 300 may be disposed to be spaced apart from each other in one direction and may be arranged in a single row or multiple rows. The drawings illustrate a case in which the inkjet heads 300 may be arranged in two rows and the inkjet heads 300 of each row may be alternately arranged. However, the disclosure is not limited thereto, and the inkjet heads 300 may be arranged in more rows or may be arranged to overlap each other instead of being alternately arranged. The shape of the inkjet head 300 is not particularly limited, but for example, the inkjet head 300 may have a quadrilateral shape.

One or more inkjet heads 300, e.g., two inkjet heads 300, may form a single pack and may be disposed to be adjacent to each other. However, the number of inkjet heads 300 included in a single pack is not limited thereto, and for example, the number of inkjet heads 300 included in a single pack may be in a range of about 1 to about 5. Although the drawings illustrate only six inkjet heads 300 disposed in the print head unit 100, this is to schematically illustrate the print head unit 100, and the number of inkjet heads 300 is not limited thereto.

The inkjet heads 300 disposed in the print head unit 100 may eject the ink 90 onto the target substrate SUB disposed on the stage STA. According to an embodiment, the print head unit 100 may move in a direction on the first support part 611, and the inkjet heads 300 may move in the direction and eject the ink 90 onto the target substrate SUB.

The print head unit 100 may move in the first direction DR1 in which the first support part 611 extends, and the inkjet heads 300 may move in the first direction DR1 to eject the ink 90 onto the target substrate SUB.

In certain embodiments, a width of the target substrate SUB measured in the first direction DR1 may be larger than a width of the print head unit 100. In this case, the print head unit 100 may eject the ink 90 throughout the target substrate SUB while moving in the first direction DR1. In a case in which target substrates SUB may be provided on the probe device 700, the print head unit 100 may eject the ink 90 onto each of the target substrates SUB while moving in the first direction DR1.

However, the disclosure is not limited thereto, and the print head unit 100 may be disposed outside the first rail RL1 and the second rail RL2 and then move in the first direction DR1 to eject the ink 90 onto the target substrate SUB. When the stage STA moves in the second direction DR2 and may be located below the base frame 600, the print head unit 100 may move between the first rail RL1 and the second rail RL2 to eject the ink 90 through the inkjet heads 300. The operation of the inkjet heads 300 is not limited thereto and may be changed in various ways within the scope in which a similar process may be implemented.

The inkjet printing device 1000 may further include the ink circulating part 500. The ink circulating part 500 may supply the ink 90 to the print head unit 100, and the inkjet heads 300 may discharge the received ink 90. The ink 90 may circulate through the ink circulating part 500 and the inkjet heads 300, and certain of the ink 90 supplied to the inkjet heads 300 may be discharged from the inkjet heads 300 and the remaining ink 90 may be supplied to the ink circulating part 500 again.

The ink circulating part 500 may be connected to the inkjet heads 300 through a first connecting tube IL1 and a second connecting tube IL2. For example, the ink circulating part 500 may supply the ink 90 to the inkjet heads 300 through the first connecting tube ILL and a flow rate of the supplied ink 90 may be adjusted through a first valve VA1. The residual ink 90 remaining after the ink 90 may be discharged from the inkjet heads 300 may be supplied to the ink circulating part 500 through the second connecting tube IL2. A flow rate of the ink 90 supplied to the ink circulating part 500 through the second connecting tube IL2 may be adjusted through a second valve VA2. Since the ink 90 circulates through the ink circulating part 500, a variation in the number of light emitting elements 95 included in the ink 90 discharged from the inkjet heads 300 may be minimized.

The ink circulating part 500 may be mounted on the base frame 600, but the disclosure is not limited thereto. The ink circulating part 500 may be provided in the inkjet printing device 1000, but the position or form of the ink circulating part 500 is not particularly limited. For example, the ink circulating part 500 may be disposed through a separate device or may be arranged in various other ways so long as the ink circulating part 500 may be connected to the inkjet heads 300.

In certain embodiments, the ink circulating part 500 may include a first circulating ink storage part 510, a second circulating ink storage part 520, a third circulating ink storage part 530, a circulation pump 550, a compressor 560, and a flow meter 580. In the ink circulating part 500, the second circulating ink storage part 520, the circulation pump 550, and the third circulating ink storage part 530 may be connected to the inkjet heads 300 and may form a single ink circulation system.

The first circulating ink storage part 510 may be a storage part in which the manufactured ink 90 may be prepared. The ink 90 including a solvent 91 and dipole elements 95 may be prepared in the first circulating ink storage part 510 of the ink circulating part 500, and the ink 90 may be supplied to the ink circulation system.

The second circulating ink storage part 520 may be connected to the first circulating ink storage part 510, and the prepared ink 90 may be supplied to the second circulating ink storage part 520. The residual ink 90 remaining after the ink 90 may be discharged from the inkjet heads 300 may be supplied to the second circulating ink storage part 520 through the second connecting tube IL2. The second circulating ink storage part 520 may be disposed between the third circulating ink storage part 530, the inkjet heads 300, and the first circulating ink storage part 510 to constitute the ink circulation system. In a case in which the second circulating ink storage part 520 may be omitted, an excess amount of ink 90 may be supplied to the third circulating ink storage part 530, and dispersion of the dipole elements 95 may not be smooth. The ink circulating part 500 may further include the second circulating ink storage part 520 to prevent the supply of an excess amount of ink 90 to the third circulating ink storage part 530. For example, the second circulating ink storage part 520 may serve as a buffer storage part in which some of the ink 90 circulating in the ink circulation system may be stored.

The ink 90 supplied to the second circulating ink storage part 520 may be supplied to the third circulating ink storage part 530 through the circulation pump 550. The circulation pump 550 may be a pump that transmits such force to a fluid to allow the ink 90 to circulate in the ink circulation system. The ink 90 supplied to the second circulating ink storage part 520 may be supplied to the third circulating ink storage part 530 by the circulation pump 550. The flow meter 580 may be provided between the circulation pump 550 and the third circulating ink storage part 530, and the flow meter 580 may measure the flow rate of the ink 90 supplied to the third circulating ink storage part 530. The circulation pump 550 may adjust the flow rate of the ink 90 supplied to the third circulating ink storage part 530 according to the flow rate of the ink 90 measured by the flow meter 580.

The ink circulating part 500 may further include the compressor 560, and the compressor 560 may adjust a pressure in the third circulating ink storage part 530. The compressor 560 may remove gas from the third circulating ink storage part 530 so that the inside of the third circulating ink storage part 530 reaches a vacuum state or may allow an inert gas to enter the third circulating ink storage part 530 from the outside so that the third circulating ink storage part 530 has a predetermined pressure. However, the disclosure is not limited thereto, and the compressor 560 of the ink circulating part 500 may be omitted.

The third circulating ink storage part 530 may be connected to the second circulating ink storage part 520 through the circulation pump 550, and thus the ink 90 may be supplied to the third circulating ink storage part 530. The third circulating ink storage part 530 may supply the ink 90 to the inkjet heads 300 through the first connecting tube IL1. In one embodiment, the third circulating ink storage part 530 may include a stirrer ST, and the stirrer ST may disperse the light emitting elements 95 in the ink 90. In the ink 90 supplied to the third circulating ink storage part 530, as the stirrer ST rotates, the dipole elements 95 may remain dispersed without sinking. For example, the stirrer ST of the third circulating ink storage part 530 may prevent a case in which the dipole elements 95 sink to the bottom of the third circulating ink storage part 530 and thus the number of dipole elements 95 in the ink 90 discharged through the inkjet heads 300 decreases. The third circulating ink storage part 530 may supply the ink 90, in which the dipole elements 95 may be smoothly dispersed, to the inkjet heads 300, and the inkjet heads 300 may discharge the ink 90 that includes the light emitting elements 95 at a predetermined level or more.

In one embodiment, the ink 90 may include the solvent 91 and the light emitting elements 95 included in the solvent 91. In an embodiment, the ink 90 may be provided in the form of a solution or a colloidal state. For example, the solvent 91 may be acetone, water, alcohol, toluene, propylene glycol (PG), propylene glycol methyl acetate (PGMA), triethylene glycol monobutyl ether (TGBE), diethylene glycol monophenyl ether (DGPE), an amide-based solvent, a dicarbonyl-based solvent, diethylene glycol dibenzoate, a tricarbonyl-based solvent, a triethyl citrate, a phthalate-based solvent, benzyl butyl phthalate, bis(2-ethylhexyl) phthalate, bis(2-ethylhexyl) isophthalate, ethyl phthalyl ethyl glycolate, or the like, or a combination thereof, but is not limited thereto. The dipole elements 95 may be included in a dispersed state in the solvent 91 and may be supplied to the print head unit 100 so as to be discharged.

Referring to FIG. 10, the inkjet head 300 may include the nozzles 350 and may discharge the ink 90 through the nozzles 350. The ink 90 discharged from the nozzles 350 may be ejected onto the target substrate SUB provided on the stage STA or the probe device 700. The nozzles 350 may be located in a bottom surface of the inkjet head 300 and may be arranged in one direction in which the inkjet head 300 extends.

The inkjet head 300 may include a base part 310, an internal tube 330, a piezo chamber 360, the nozzles 350, a discharge part 370, and an actuator 390.

The base part 310 may constitute a main body of the inkjet head 300. The base part 310 may be attached to the print head unit 100. As described above with reference to FIG. 7, the base part 310 may have a shape that extends in the first direction DR1 and the second direction DR2. However, the disclosure is not limited thereto, and the base part 310 may have a circular shape or a polygonal shape.

The discharge part 370 may be a portion of the base part 310 of the inkjet head 300 in which the piezo chamber 360 and the nozzle 350 may be disposed. The drawings illustrate a case in which discharge parts 370 connected to the base part 310 and discharge parts 370 spaced apart therefrom may be disposed and the piezo chamber 360 and the nozzle 350 may be formed between the discharge parts 370. However, the discharge parts 370 may substantially be integrally formed and constitute a single member instead of being spaced apart from each other, and the nozzle 350 may be formed in the shape of a hole that passes through the discharge part 370. For example, the discharge parts 370 may be formed as a single member instead of being spaced apart from each other. However, the disclosure is not limited thereto, and in certain embodiments, the inkjet heads 300 may have units each including the discharge part 370 having the nozzle 350 formed therein. In this case, the discharge parts 370 may be spaced apart from each other and disposed to be connected to the base part 310.

The internal tube 330 may be disposed in the base part 310 and connected to an internal flow path of the print head unit 100, and the ink 90 may be supplied to the internal tube 330 from the ink circulating part 500. The ink 90 may be supplied to the print head unit 100 through the first connecting tube IL1 connected to the ink circulating part 500, and the residual ink 90 remaining after the ink 90 may be discharged from the nozzle 350 may be supplied to the ink circulating part 500 through the second connecting tube IL2. The ink 90 may be supplied to the internal tube 330 of the inkjet head 300 through an inlet 331 connected to the internal flow path of the print head unit 100, and the residual ink 90 remaining after the ink 90 may be discharged may exit the internal flow path through an outlet 333. The inlet 331 may be connected to the first connecting tube ILL and the outlet 333 may be connected to the second connecting tube IL2. The inlet 331 may be disposed at a first end of the internal tube 330, and the outlet 333 may be disposed at a second end of the internal tube 330, i.e., the side of the internal tube 330 that may be opposite to the inlet 331.

The inkjet head 300 may include a filter F disposed in the internal tube 330. The filter F may, when the ink 90 flowing along the internal tube 330 enters the nozzle 350, prevent materials other than the light emitting elements 95 from entering the nozzle 350. Accordingly, the filter F may prevent the nozzle 350 from being clogged due to foreign matter and may prevent foreign matter from being mixed with the ink 90 discharged from the nozzle 350.

The base part 310 may have a shape extending in a direction, and the internal tube 330 may be formed in a direction in which the base part 310 extends. The ink 90 supplied through the print head unit 100 may flow through the internal tube 330 and then be discharged from the nozzle 350 through the piezo chamber 360 of the inkjet head 300.

The nozzles 350 may be disposed in the discharge part 370 disposed at a surface, e.g., a lower surface, of the base part 310. The nozzles 350 may be spaced apart from each other and arranged in the direction in which the base part 310 extends and may be connected to the internal tube 330 through the piezo chamber 360, which passes through the discharge part 370 of the base part 310, and may discharge the ink 90. Although not illustrated in the drawings, the nozzles 350 may be arranged in a single row or in multiple rows. Although the drawings illustrate a case in which four nozzles 350 may be formed in the inkjet head 300, the disclosure is not limited thereto. In certain embodiments, the number of nozzles 350 included in the inkjet head 300 may be in a range of about 128 to about 1,800. The nozzles 350 may discharge the ink 90 that enters the piezo chamber 360 along the internal tube 330. The amount of ink 90 ejected through the nozzles 350 may be adjusted according to a voltage applied to each nozzle 350. In one embodiment, the amount of ink 90 discharged at one time from each nozzle 350 may be in a range of about 1 to about 50 pico-liters (pL), but the disclosure is not limited thereto.

The ink 90 discharged through the nozzle 350 may include the solvent 91 and the light emitting elements 95 dispersed in the solvent 91. According to an embodiment, the light emitting elements 95 may have a shape extending in a direction. The light emitting elements 95 randomly dispersed in the ink 90 may flow along the internal tube 330 and then be supplied to the nozzle 350. Since the light emitting elements 95 have a shape extending in a direction, the light emitting elements 95 may be oriented in a direction of the major axis. A light emitting element 95 may partially include portions having different polarities. For example, the light emitting element 95 may include a first end portion having a first polarity and a second end portion having a second polarity, and the first end portion and the second end portion may be both end portions of the light emitting element 95 in the direction of the major axis. The direction in which the light emitting elements 95 extending in a direction may be oriented may be defined on the basis of a direction that the first end portion faces. The light emitting elements 95 that flow in the internal tube 330, the piezo chamber 360, and the nozzle 350 of the inkjet head 300 may be dispersed in random directions instead of being oriented in a constant direction. However, the disclosure is not limited thereto, and the light emitting elements 95 may flow in the internal tube 330, the piezo chamber 360, and the nozzle 350 while being oriented in a specific direction.

The piezo chamber 360 may be disposed between the nozzle 350 and the internal tube 330 and may be a place where the ink 90 may be stored temporarily before being discharged through the nozzle 350. When a hydraulic pressure of the actuator 390 may be applied to the piezo chamber 360, the ink 90 may be discharged through the nozzle 350. The piezo chamber 360 may be connected to a lower portion of the internal tube 330 and may be disposed to correspond to each of the nozzles 350.

The actuator 390 may be disposed in the discharge part 370 of the base part 310. The actuator 390 may be disposed to surround the piezo chamber 360. The actuator 390 may apply a hydraulic pressure to the ink 90 introduced into the piezo chamber 360 to allow the ink 90 to be smoothly discharged through the nozzle 350. The actuator 390 and the discharge part 370 may have substantially a same length, but the disclosure is not limited thereto. The actuator 390 may be disposed to correspond to the piezo chamber 360 and to surround the piezo chamber 360 or may also be disposed to be spaced apart from other actuators 390 at a distance at which the piezo chambers 360 may be spaced apart.

According to an embodiment, the actuator 390 may control the amount of ink 90 discharged from the piezo chamber 360 through the nozzle 350. The actuator 390 may adjust the hydraulic pressure applied to the ink 90 and may adjust the amount of droplets of the ink 90 discharged into a unit space during the printing process of the inkjet printing device 1000. For example, the amount of ink 90 discharged at one time from the nozzle 350 may be in a range of about 1 to about 50 pL, and the amount of discharged ink 90 that may be necessary for a unit space in one printing process may be about 50 pL or more. In this case, the actuator 390 may adjust the strength, frequency, or the like of the hydraulic pressure to control the amount of droplets of the ink 90 discharged from the nozzle 350 to be different in one printing process.

In the inkjet printing device 1000, the amount of discharged ink 90 may gradually decrease as the process of discharging the ink 90 may be performed. Specifically, the light emitting elements 95 included in the ink 90 may accumulate in the piezo chamber 360 of the inkjet head 300 and clog the nozzle 350. Thus, the ink 90 may not be able to be discharged through the nozzle 350 and may be discharged non-uniformly. As a result, linear stains become visible and the display quality may be degraded.

According to an embodiment, the inkjet printing device 1000 may include the suctioning part 800 connected to the inkjet head 300 to remove the light emitting elements 95 accumulated in the piezo chamber 360 of the inkjet head 300.

As illustrated in FIGS. 6 and 9, the inkjet printing device 1000 may include the suctioning part 800 that extends from the second connecting tube IL2 connected to the print head unit 100. The suctioning part 800 may suction the ink 90 remaining in the print head unit 100 and discharge the suctioned ink 90 to the outside. Specifically, the suctioning part 800 may suction the light emitting elements 95 of the ink 90 that may be accumulated in the piezo chamber 360 of the inkjet head 300 to discharge the light emitting elements 95 to the outside through the outlet 333 of the inkjet head 300.

Figure 11:
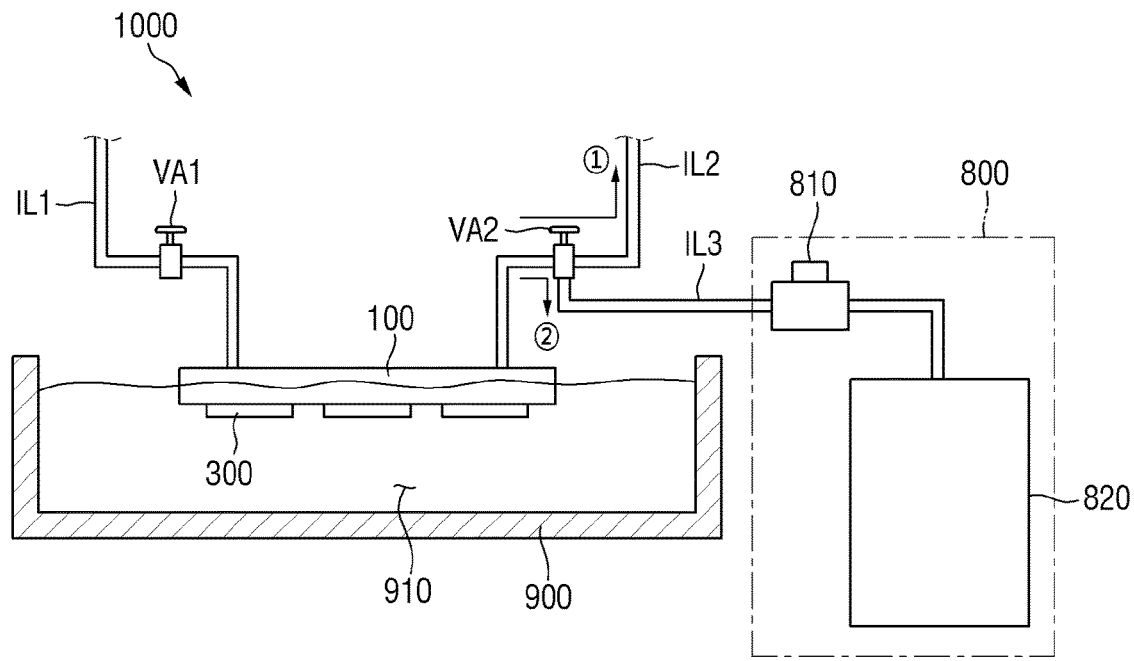
FIG. 11 is a schematic view illustrating an inkjet printing device according to an embodiment.

FIG. 11 is a schematic view illustrating the inkjet printing device 1000 according to an embodiment.

Referring to FIG. 11 in conjunction with FIG. 9, the inkjet printing device 1000 may further include the suctioning part 800. The suctioning part 800 may be connected to the inkjet head 300 through a third connecting tube IL3. The suctioning part 800 may include the third connecting tube IL3, a suction pump 810, and a suctioned ink storage part 820. In the suctioning part 800, the third connecting tube IL3, the suction pump 810, and the suctioned ink storage part 820 may be connected to the inkjet head 300 and may form a single ink discharge system.

The third connecting tube IL3 may be a flow path for connecting the suctioning part 800 to the inkjet head 300. The third connecting tube IL3 may be connected to the second connecting tube IL2 to be connected to the inkjet head 300 of the print head unit 100 through the second connecting tube IL2. For example, the third connecting tube IL3 may be connected to the second valve VA2 of the second connecting tube IL2, which may be connected to the inkjet head 300, so as to be connected to the inkjet head 300.

In an embodiment, the connection of the suctioning part 800 to the ink circulating part 500 may be blocked while the ink 90 of the ink circulating part 500 may be supplied to the print head unit 100. The second valve VA2 connected to the third connecting tube IL3 may selectively control a flow path in which the ink 90 moves to the second circulating ink storage part 520 and a flow path in which the ink 90 moves to the third connecting tube IL3. To this end, the second valve VA2 may be a three-way valve. The three-way valve may be a valve having fluid ports formed in three directions and may switch a fluid flow path.

In an embodiment, the second valve VA2 may switch between a first flow path (①) in which the ink 90 moves from the print head unit 100 to the second circulating ink storage part 520 through the second valve VA2 and a second flow path (②) in which the ink 90 moves from the print head unit 100 to the third connecting tube IL3 through the second valve VA2. The second valve VA2 may be switched to the first flow path (①) while the ink 90 may be supplied to the print head unit 100 through the ink circulating part 500 and the inkjet printing process may be performed. The ink 90 may be blocked from moving to the third connecting tube IL3 by the second valve VA2 and may move to the second circulating ink storage part 520. The second valve VA2 may be switched to the second flow path (②) while the suctioning process may be performed to suction the ink 90 from the inkjet head 300 of the print head unit 100. The ink 90 may be blocked from moving to the second circulating ink storage part 520 by the second valve VA2 and may move to the suctioning part 800 through the third connecting tube IL3.

The ink 90 remaining in the inkjet head 300 of the print head unit 100 may be supplied to the suctioned ink storage part 820 through the suction pump 810. The suction pump 810 may be a pump that transmits power to a fluid to allow the ink 90 to be suctioned using the suctioning part 800. The suction pump 810 may operate while the suctioning process may be performed to suction the ink 90 from the inkjet head 300 of the print head unit 100, and the suction pump 810 may suction the ink 90 remaining in the inkjet head 300 and supply the ink 90 to the suctioned ink storage part 820.

The ink 90 suctioned using the suctioning part 800 may be supplied to the suctioned ink storage part 820. The residual ink 90 remaining after the ink 90 may be discharged from the inkjet head 300 may be supplied to the suctioned ink storage part 820 through the suction pump 810. The suctioned ink storage part 820 may be a storage part in which the supplied ink 90 may be stored. The ink 90 stored in the suctioned ink storage part 820 may be collected and then reused as ink or discarded.

The inkjet printing device 1000 according to an embodiment may further include a dipping bath 900. The dipping bath 900 may be a storage part that holds a suction solution 910 that may be suctioned together with the ink 90 during the suctioning process of the print head unit 100.

Like the ink circulating part 500 and the suctioning part 800, the dipping bath 900 may be provided separately from the print head unit 100 in the inkjet printing device 1000. In an embodiment, the dipping bath 900 may be disposed at one end of the stage STA (see FIG. 6), and the print head unit 100 may move downward and be immersed in the dipping bath 900.

The suction solution 910 included in the dipping bath 900 may include materials of the ink 90 discharged from the print head unit 100. Since the suction solution 910 moves through the print head unit 100, from which the ink 90 may be discharged, and the second connecting tube IL2 of the ink circulating part 500, components of the ink 90 may be changed when the suction solution 910 remains in the print head unit 100 and the second connecting tube IL2. To this end, the ink 90 or the solvent 91 of the ink 90 may be used as the suction solution 910 included in the dipping bath 900. The ink 90 or the solvent 91 of the ink 90 may be the same as described above, and thus description thereof will be omitted.

By including the suctioning part 800 and the dipping bath 900, the inkjet printing device 1000 according to an embodiment may, when non-discharge of ink occurs during the inkjet printing device, suction the light emitting elements 95 accumulated in the inkjet head 300 to address the non-discharge of ink.

Hereinafter, using the inkjet printing device 1000 described above, a method of addressing non-discharge in the inkjet printing device 1000 that may be capable of addressing non-discharge of ink therein will be disclosed.

Figure 12:
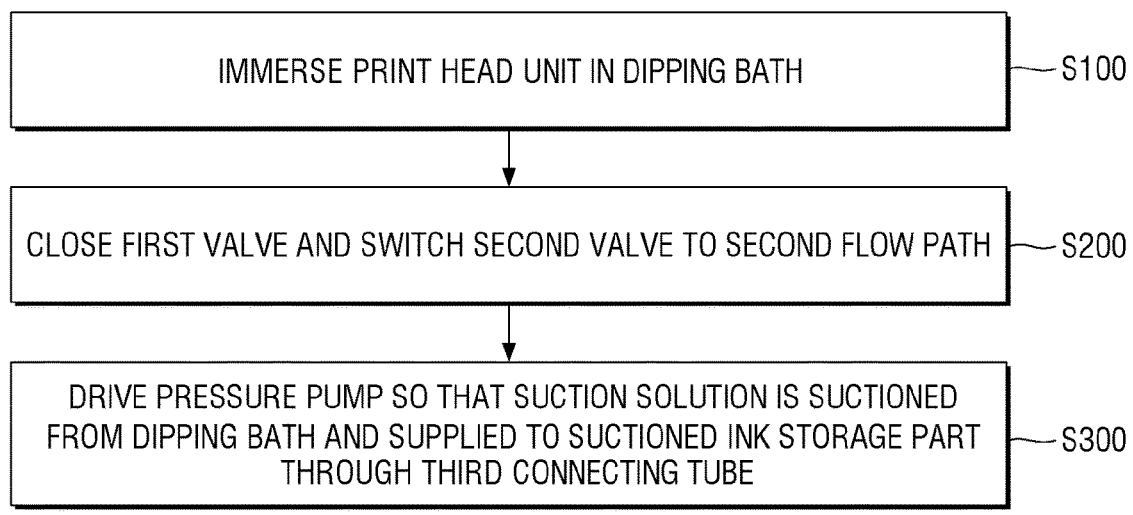
FIG. 12 is a flowchart schematically illustrating a method of addressing non-discharge in the inkjet printing device according to an embodiment.

FIG. 12 is a flowchart schematically illustrating a method of addressing non-discharge in the inkjet printing device according to an embodiment.

The method of addressing the non-discharge in the inkjet printing device according to an embodiment may include immersing the print head unit 100 in the dipping bath 900 (S100), closing the first valve VA1 and switching the second valve VA2 to the second flow path (②) (S200), and driving a pressure pump 810 to suction the suction solution 910 from the dipping bath 900 and supply the suction solution 910 to the suctioned ink storage part 820 through the third connecting tube IL3 (S300).

In the method of addressing the non-discharge in the inkjet printing device 1000 according to an embodiment, the print head unit 100 may be immersed in the dipping bath 900 and the suctioning part 800 may be driven to address the non-discharge. Hereinafter, further referring to other drawings, the method of addressing the non-discharge in the inkjet printing device 1000 will be described in detail.

FIGS. 13 to 16 are schematic views illustrating each operation of the method of addressing the non-discharge in the inkjet printing device according to an embodiment. The method of addressing the non-discharge in the inkjet printing device will be described below with reference to FIGS. 13 to 16 in conjunction with FIG. 12.

Figure 13:
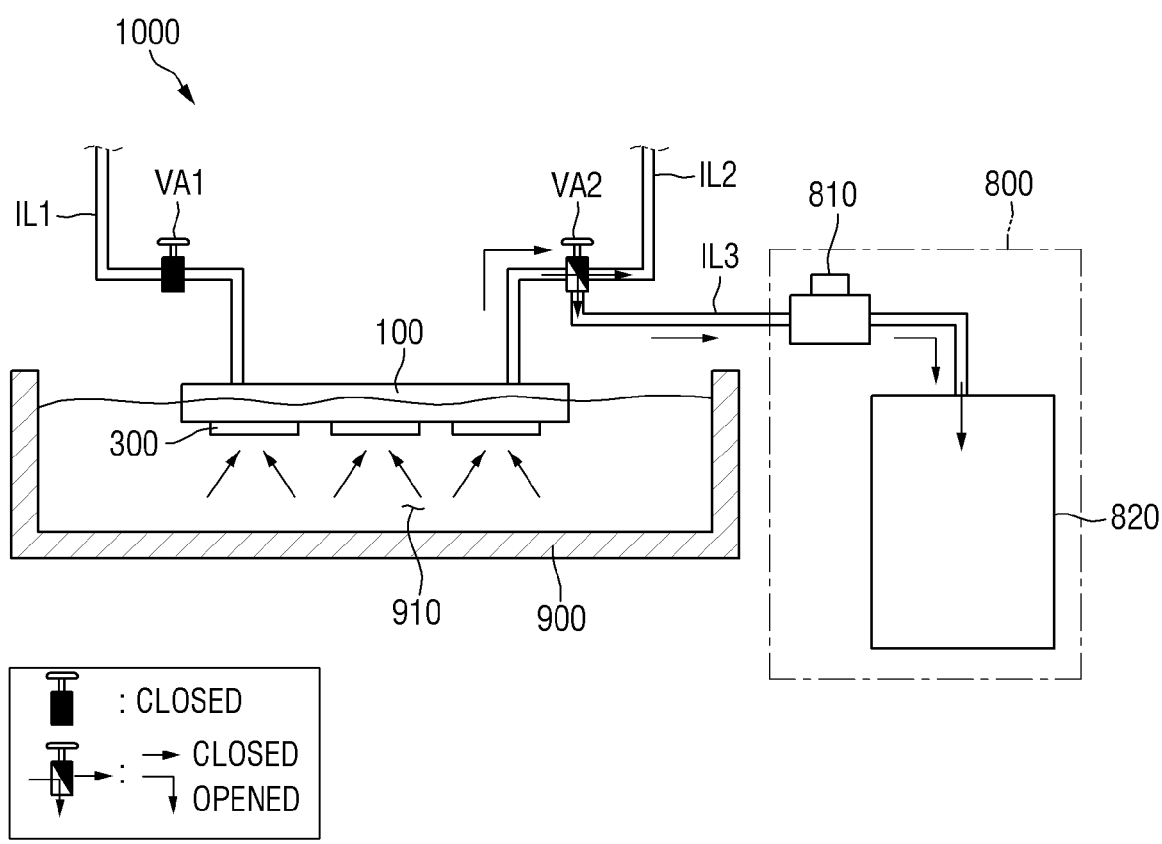
FIGS. 13 to 16 are schematic views illustrating each operation of the method of addressing non-discharge in the inkjet printing device according to an embodiment.

Referring to FIG. 13, the inkjet printing device 1000 including the print head unit 100, the suctioning part 800, and the dipping bath 900 may be prepared. In the inkjet printing device 1000, due to continuous discharge of ink including light emitting elements, the light emitting elements may be accumulated in an inkjet head, causing non-discharge of the ink.

First, the print head unit 100 may be immersed in the prepared dipping bath 900 (S100).

The dipping bath 900 may be filled with the suction solution 910 including the ink or the solvent included in the ink. The print head unit 100 may be immersed in the suction solution 910 such that at least the inkjet heads 300 may be fully immersed therein. Since nozzles that may suction the suction solution 910 may be disposed in the inkjet head 300, for example, the print head unit 100 may be immersed such that the nozzles may be immersed in the suction solution 910.

Next, the first valve VA1 provided in the inkjet printing device 1000 may be closed, and the second valve VA2 may be switched to the second flow path (②) (S200).

The inkjet printing device 1000 may include the first connecting tube IL1 connected to a side of the print head unit 100, the second connecting tube IL2 connected to another side of the print head unit 100, the first valve VA1 provided in the first connecting tube ILL and the second valve VA2 provided in the second connecting tube IL2. First, the first valve VA1 provided in the first connecting tube IL1 may be closed. The first valve VA1 serves to open and close the inside of the first connecting tube IL1 to block movement of ink to the first connecting tube IL1 when the first valve VA1 may be closed.

Then, the second valve VA2 provided in the second connecting tube IL2 may be switched to the second flow path (②). The second valve VA2 may be disposed between the second connecting tube IL2 and the third connecting tube IL3 and may switch between the first flow path (①) in which the second connecting tube IL2 extends and the second flow path (②) which may be connected from the second connecting tube IL2 to the third connecting tube IL3. As the second valve VA2 may be switched to the second flow path (②), a flow path in which movement of the ink may be possible may be formed through the second connecting tube IL2 and the third connecting tube IL3. Accordingly, the ink may move from the print head unit 100 to the second connecting tube IL2, the second valve VA2, and the third connecting tube IL3. When the second valve VA2 is switched to the second flow path (②), the first flow path (①) may be closed to block the movement of the ink therein.

Next, the pressure pump 810 may be driven to suction the suction solution 910 from the dipping bath 900 and supply the suction solution 910 to the suctioned ink storage part 820 through the third connecting tube IL3 (S300).

The inkjet printing device 1000 according to an embodiment may include the suctioning part 800 including the third connecting tube IL3. The suctioning part 800 may include the suction pump 810 connected to the third connecting tube IL3 to suction the ink and the suctioned ink storage part 820 that stores the suctioned ink.

When the pressure pump 810 is driven, a suction force acts on the third connecting tube IL3 connected to the pressure pump 810 and on the second valve VA2, the second connecting tube IL2, the print head unit 100, and the inkjet head 300, and the suction solution 910 may be suctioned from the nozzles of the inkjet head 300. The suction solution 910 suctioned from the inkjet head 300 may be supplied to the suctioned ink storage part 820 along a path of the print head unit 100, the second connecting tube IL2, the second valve VA2, the third connecting tube IL3, and the pressure pump 810 through the inside of the inkjet head 300.

In one embodiment, the suction solution 910 suctioned from the nozzles moves to the second connecting tube IL2 along with the ink remaining in the inkjet head 300. Accordingly, the light emitting elements accumulated in the piezo chamber of the inkjet head 300 may be moved, and thus the non-discharge of the ink may be addressed. This will be described in more detail below.

Figure 14:
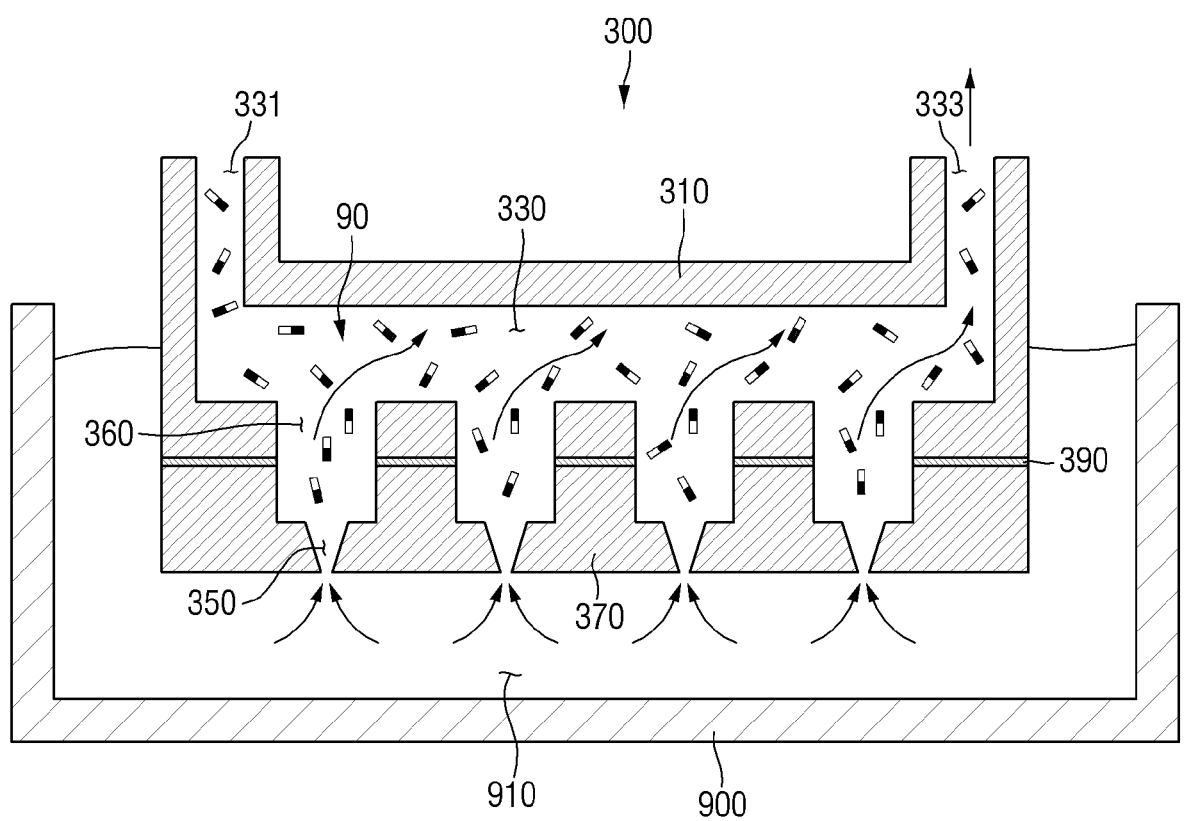
Figure 15:
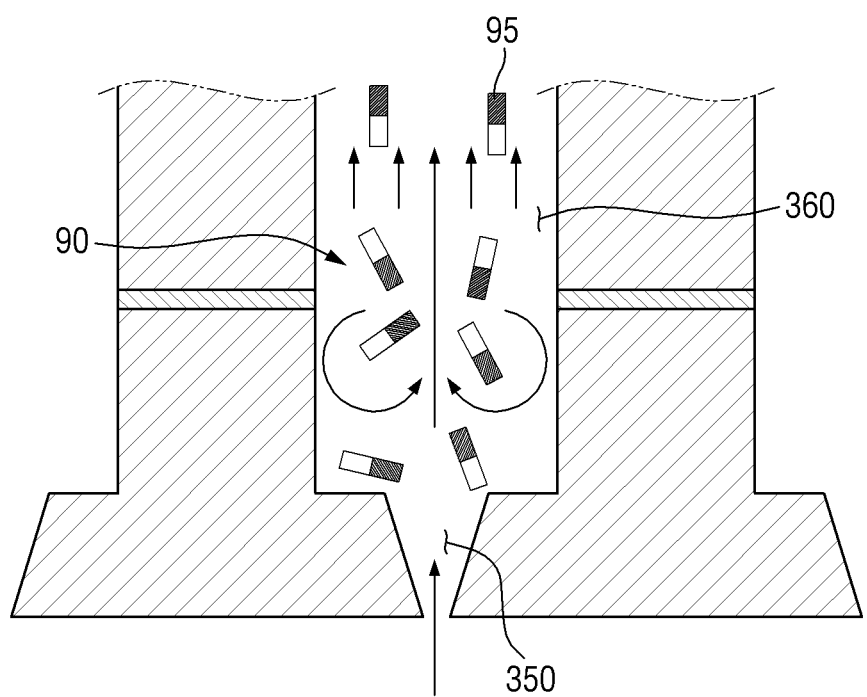

Referring to FIGS. 14 and 15 in conjunction with FIG. 13, movement of the ink 90 may be blocked in the inlet 331 of the inkjet head 300 due to closing of the first valve VA1, and the outlet 333 may be the outlet 333 through which the ink 90 may be suctioned out due to driving the suction pump 810.

The suction solution 910 included in the dipping bath 900 may be suctioned from the nozzles 350 due to a suction force caused by driving the suction pump 810. The suction solution 910 suctioned from the nozzles 350 may, while passing through the piezo chamber 360 in a fluid flow, push the ink 90 including the light emitting elements 95 remaining in the piezo chamber 360 and move to the internal tube 330. The suction solution 910 suctioned into the nozzle 350, of which a diameter may be very narrow, generates a turbulent flow in the piezo chamber 360. Due to the turbulent flow, for example, an irregular fluid flow may cause a vortex to be irregularly generated in the piezo chamber 360, and thus the light emitting elements 95 accumulated in the piezo chamber 360 may float. Due to the turbulent flow generated by the ink 90 and the suction solution 910 remaining in the piezo chamber 360, the light emitting elements 95 may be suctioned out of the piezo chamber 360 to the outlet 333 through the internal tube 330. Accordingly, since the nozzle 350, which may be clogged due to the accumulation of the light emitting elements 95 in the piezo chamber 360, may be unclogged, the non-discharge of the ink 90 may be addressed.

Referring back to FIG. 13, the ink 90 and the suction solution 910 that move in the inkjet head 300 move to the second connecting tube IL2, which may be connected to a side of the print head unit 100, and move to the third connecting tube IL3 through the second valve VA2. Finally, the ink 90 and the suction solution 910 may be supplied to the suctioned ink storage part 820 through the suction pump 810.

When the light emitting elements 95 accumulated in the piezo chamber 360 of the inkjet head 300 may be removed and thus the non-discharge in the inkjet printing device 1000 may be addressed, driving of the suction pump 810 may be stopped to complete the process of addressing the non-discharge in the inkjet printing device 1000.

Figure 16:
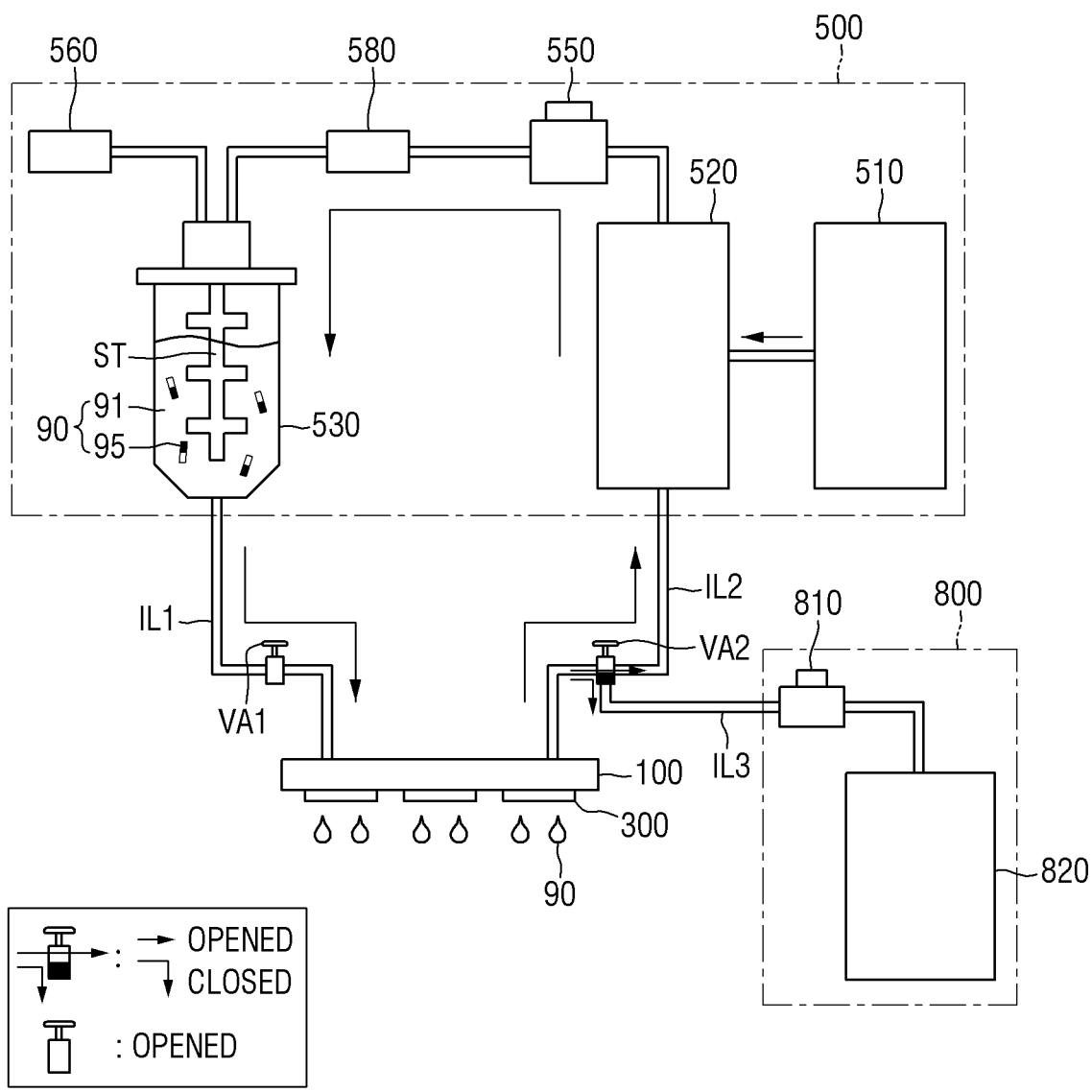

Then, referring to FIG. 16, in the inkjet printing device 1000 in which the non-discharge may be addressed, the first valve VA1 may be opened, and the second valve VA2 may be switched to the first flow path (①). The ink 90 may be circulated through the ink circulating part 500 to perform a normal printing process using the inkjet printing device 1000.

As described above, in the method of addressing the non-discharge in the inkjet printing device according to an embodiment, the suctioning part 800 and the dipping bath 900 may be provided, and through the suctioning process in which the suction solution 910 may be suctioned from the nozzle 350 of the inkjet head 300, the light emitting elements 95 accumulated in the piezo chamber 360 of the inkjet head 300 may be removed. Consequently, stains that occur due to the non-discharge of the ink 90 may be reduced to improve the display quality.

Hereinafter, the embodiments will be described in more detail using a manufacturing example and experimental examples.

Manufacturing Example: Manufacture of Inkjet Printing Device

The inkjet printing device illustrated in FIGS. 9 to 11 was manufactured. The number of nozzles of the inkjet printing device was 256.

Experimental Example 1: Observation of Changes in Discharge States According to Progress of Printing Process Printing was performed using the inkjet printing device under different printing conditions as below, and discharge states of nozzles were observed.

Condition #1: Only a solvent was supplied to the inkjet printing device and printing was performed.

Condition #2: The solvent was mixed with about 0.4 parts by weight of light emitting elements and printing was performed.

Condition #3: The printing process was performed for about 30 minutes under Condition #2.

Condition #4: After the printing process was performed under Condition #3, the printing process was performed for about two more days.

Experimental Example 2: Observation of Changes in Discharge States According to Each Process for Addressing Clogging of Nozzles The inkjet printing device, with which printing was performed under Condition #4 and in which non-discharge of ink occurred due to clogging of the 256 nozzles, was prepared. Processes for addressing clogging of the nozzles were sequentially performed under the following conditions, and then discharge states of the nozzles were observed.

Condition #5: Waveform frequency swap was performed using an actuator.

Condition #6: After the process of Condition #5 ended, purging was performed with a weak pressure.

Condition #7: After the process of Condition #6 ended, purging was performed with a stronger pressure as compared to Condition #6.

Condition #8: After the process of Condition #7 ended, the suctioning process according to FIGS. 12 to 15 was performed.

Figure 17:
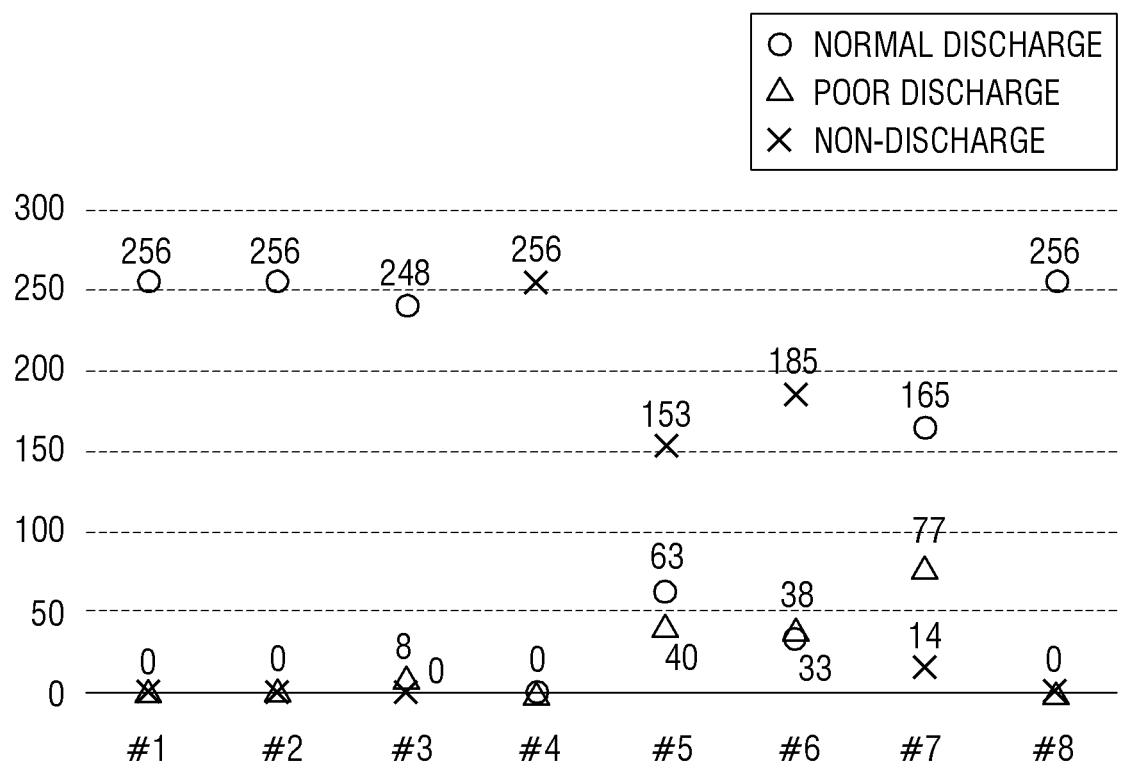
FIG. 17 is a graph schematically showing discharge states of nozzles according to Experimental Examples 1 and 2.
Figure 18:
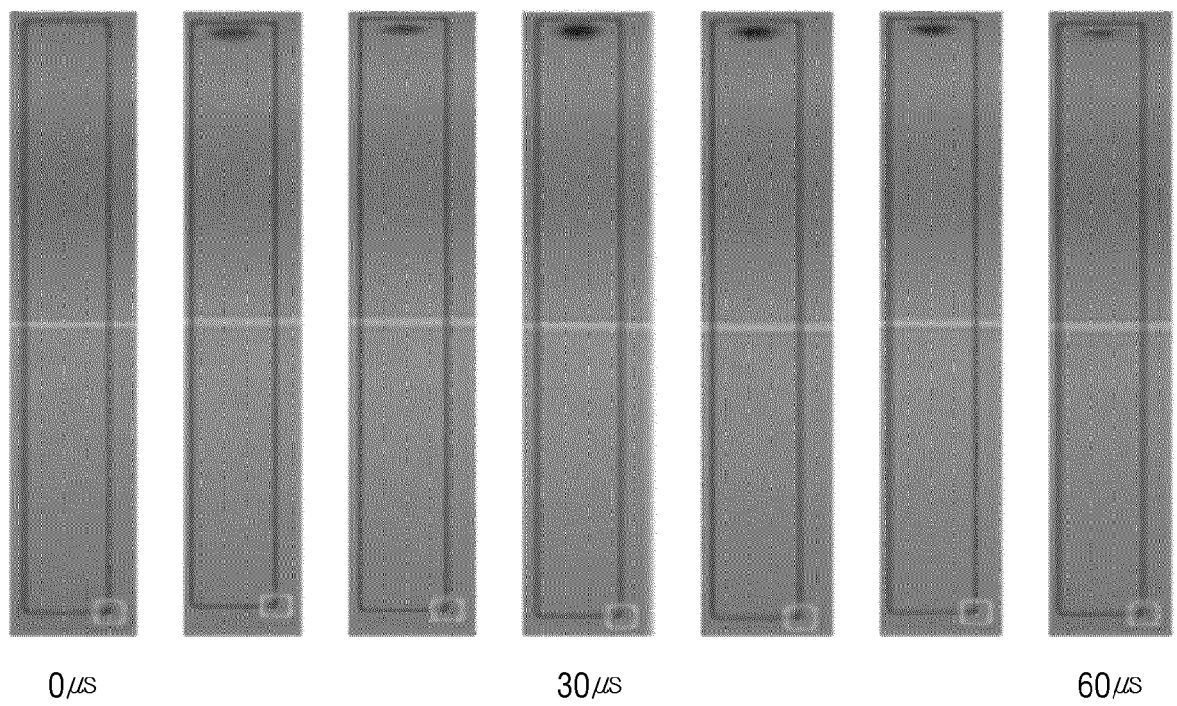
FIG. 18 schematically shows images taken about every 10 μs during about 60 μs of a process of discharging ink from nozzles after a process of condition #4 ended.

The discharge states of the nozzles according to Experimental Examples 1 and 2 are schematically illustrated in FIG. 17. FIG. 18 schematically shows images taken about every 10 μs during about 60 μs of a process of discharging ink from nozzles after the process of condition #4 ended.

Figure 19:
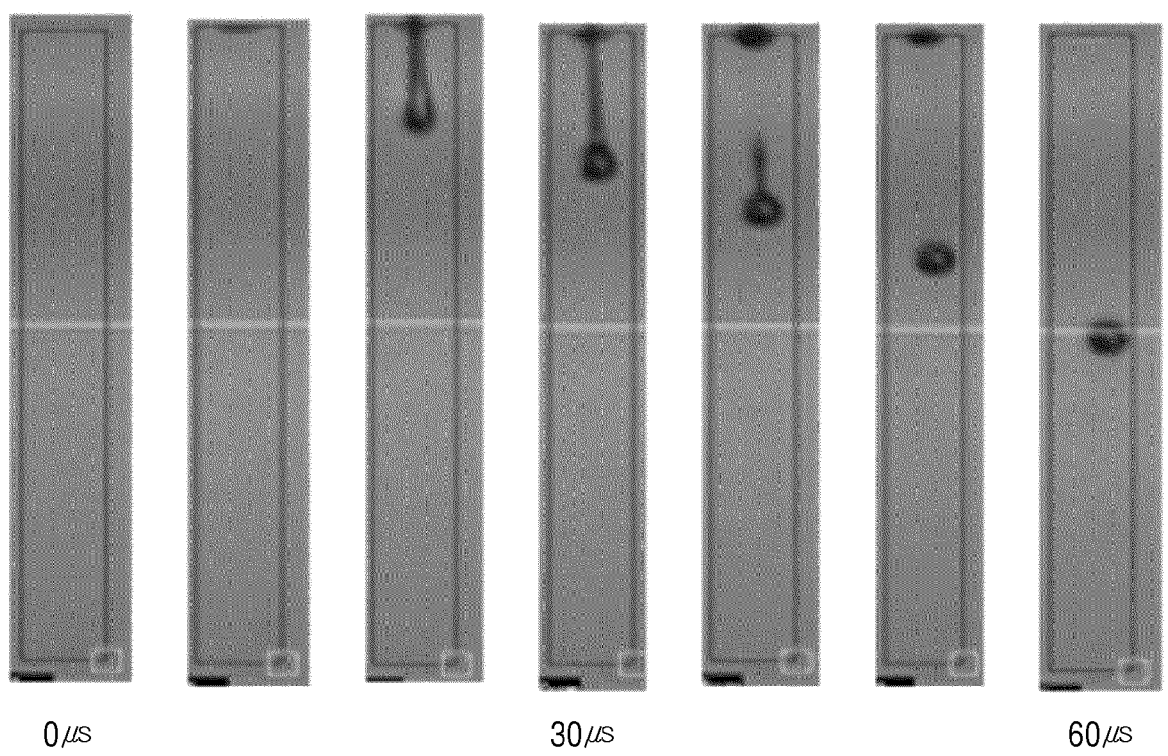
FIG. 19 schematically shows images taken about every 10 μs during about 60 μs of a process of discharging ink from nozzles after a process of condition #8 ended.

FIG. 19 shows images taken about every 10 μs during about 60 μs of the process of discharging ink from the nozzles after the process of condition #8 ended. Here, in FIG. 17, the horizontal axis represents each condition, and the vertical axis represents the number of nozzles.

Referring to FIG. 17, under Condition #1 in which only the solvent was printed, the solvent was discharged normally from all 256 nozzles. Under Condition #2 in which the solvent mixed with the light emitting elements was printed, the solvent mixed with the light emitting elements was discharged normally from all the nozzles. Under Condition #3 in which the solvent mixed with the light emitting elements was printed for about 30 minutes, poor discharge occurred in eight nozzles, and under Condition #4 in which the solvent mixed with the light emitting elements was printed for about two days, non-discharge occurred in all 256 nozzles.

As illustrated in FIG. 18, it was confirmed that ink was not discharged from the nozzles after the process of Condition #4 ended.

Referring back to FIG. 17, under Condition #5 in which the waveform frequency swap was performed to address the non-discharge in the inkjet printing device in which the non-discharge occurred in all the nozzles, normal discharge occurred in 63 nozzles, poor discharge occurred in 40 nozzles, and non-discharge stilled occurred in 153 nozzles. Under Condition #6 in which weak purging was performed, normal discharge occurred in 33 nozzles and non-discharge occurred in 185 nozzles, and the number of nozzles in which normal discharge occurred rather decreased. Under Condition #7 in which strong purging was performed, normal discharge occurred in 165 nozzles and non-discharge occurred in 14 nozzles, and the non-discharge was addressed to some extent.

Under Condition #8 in which the suctioning process illustrated in FIGS. 12 to 15 was performed, normal discharge occurred in all 256 nozzles.

As illustrated in FIG. 19, it was confirmed that ink was normally discharged from nozzles after Condition #8 ended.

In this way, it was confirmed that, by including the suctioning part and performing the suctioning process, the method of addressing non-discharge in the inkjet printing device according to an embodiment may be able to address the non-discharge in the inkjet printing device.

According to an inkjet printing device and a method of addressing non-discharge therein according to embodiments, a suctioning part and a dipping bath can be provided. In this way, a suctioning process, in which a suction solution may be suctioned from a nozzle of an inkjet head, can be performed to remove light emitting elements accumulated in a piezo chamber of the inkjet head. Therefore, stains that occur due to non-discharge of ink can be reduced to improve the display quality.

Advantageous effects according to the embodiments are not limited to those mentioned above, and various other advantageous effects are incorporated herein.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed is:

1. An inkjet printing device comprising:
   a print head including nozzles that discharge an ink including light emitting elements;

a dipping bath in which the print head is immersed and which includes a suction solution; and a suctioning part which is connected to the print head and suctions the suction solution along with the ink remaining in the print head;

a first connecting tube which is connected to a first end of the print head and along which the ink is supplied to the print head;

a second connecting tube which is connected to a second end of the print head and along which the ink is moved from the print head;

a first valve disposed in the first connecting tube and adjusting supply of the ink;

a second valve disposed in the second connecting tube and adjusting a flow rate of the ink;

a first circulating ink storage part in which the ink is stored;

a second circulating ink storage part which receives the ink from the first circulating ink storage part and is connected to the second connecting tube;

a circulation pump that moves the ink from the second circulating ink storage part; and a third circulating ink storage part that receives the ink from the circulation pump, wherein the third circulating ink storage is connoted to the first connecting tube and supplies the ink to the print head, and the print head comprises an inkjet head comprising:
an internal tube that passes through an inner portion of the inkjet head; and
piezo chambers connected from the internal tube to a lower portion thereof.

2. The inkjet printing device of claim 1, wherein the suctioning part comprises:
a third connecting tube connected to the second connecting tube;
a suction pump connected to the third connecting tube and transmitting suction force to the ink; and
a suctioned ink storage part which is connected to an end of the third connecting tube and in which the ink supplied through the suction pump is stored.

3. The inkjet printing device of claim 2, wherein
the third connecting tube is connected to the second connecting tube through the second valve, and
the ink moves to the second connecting tube or the third connecting tube in accordance with opening or closing of the second valve.

4. The inkjet printing device of claim 3, wherein the second valve is a three-way valve.

5. The inkjet printing device of claim 1, wherein the dipping bath includes the suction solution and is provided separately from the print head.

6. The inkjet printing device of claim 5, wherein the suction solution is the ink or a solvent included in the ink.

7. The inkjet printing device of claim 1, wherein the inkjet head further comprises:
an inlet connected from the first connecting tube; and
an outlet which is disposed on a side of the internal tube that is opposite to the inlet and is connected to the second connecting tube,
the internal tube passes through the inner portion of the inkjet head from the inlet, and
each of the nozzles is disposed in one of the piezo chambers.

8. A method of addressing non-discharge in an inkjet printing device that includes a print head including nozzles that discharge an ink including light emitting elements, a dipping bath in which the print head is immersed and which includes a suction solution, and a suctioning part which is connected to the print head and suctions the suction solution along with the ink remaining in the print head, a first connecting tube which is connected to a first end of the print head and along which the ink is supplied to the print head, a second connecting tube which is connected to a second end of the print head and along which the ink is moved from the print head, a first valve disposed in the first connecting tube and adjusting supply of the ink, a second valve disposed in the second connecting tube and adjusting a flow rate of the ink, a first circulating ink storage part in which the ink is stored, a second circulating ink storage part which receives the ink from the first circulating ink storage part and is connected to the second connecting tube, a circulation pump that moves the ink from the second circulating ink storage part, and a third circulating ink storage part that receives the ink from the circulation pump, the third circulating ink storage part being connected to the first connecting tube and supplying the ink to the print head, the method comprising:
immersing the print head in the dipping bath;
closing the first valve connected to a first end of the print head and switching the second valve connected to a second end of the print head; and
driving a suction pump of the suctioning part connected to the second valve to suction the suction solution included in the dipping bath through the print head along with the ink remaining in the print head, wherein
the print head comprises an inkjet head comprising:
an internal tube that passes through an inner portion of the inkjet head; and
a piezo chamber connected from the internal tube to a lower portion thereof.

9. The method of claim 8, wherein the immersing of the print head in the dipping bath comprises immersing the print head so that nozzles of an inkjet head provided in the print head are immersed in the suction solution.

10. The method of claim 8, wherein the suctioning part comprises:
a third connecting tube connected to the second connecting tube;
a suction pump connected to the third connecting tube and transmitting suction force to the ink; and
a suctioned ink storage part which is connected to an end of the third connecting tube and in which the ink supplied through the suction pump is stored.

11. The method of claim 10, wherein the closing of the first valve and switching of the second valve comprises:
closing the first valve to block movement of the ink to the first connecting tube; and
switching the second valve to form a flow path in which the ink is movable through the second connecting tube and the third connecting tube.

12. The method of claim 10, further comprising, after the suctioning of the suction solution and the ink, opening the first valve and switching the second valve to block movement of the ink to the third connecting tube.

13. The method of claim 10, wherein, by driving the suction pump, a suction force acts on the third connecting tube connected to the suction pump and acts on the second valve, the second connecting tube, and the print head to suction the suction solution.

14. The method of claim 13, wherein
the inkjet head includes nozzles, and
the suction solution is suctioned from the nozzles.

15. The method of claim 14, wherein, as the suction solution is suctioned through the nozzles, a turbulent flow is formed in the piezo chamber connected to the nozzles.

16. The method of claim 15, wherein
    due to the turbulent flow, light emitting elements of the ink that are accumulated in the piezo chamber float, and
    along with the suction solution, the ink including the light emitting elements is suctioned to the suctioning part through the second connecting tube.

17. The method of claim 16, wherein the ink and the suction solution are stored in the suctioned ink storage part through the suction pump of the suctioning part.

* * * * *